US012665019B2

(12) United States Patent
Tsukamoto

(10) Patent No.: US 12,665,019 B2
(45) Date of Patent: Jun. 23, 2026

(54) SEMICONDUCTOR DEVICE

(71) Applicant: SONY SEMICONDUCTOR SOLUTIONS CORPORATION, Kanagawa (JP)

(72) Inventor: Masanori Tsukamoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 764 days.

(21) Appl. No.: 17/918,412

(22) PCT Filed: Feb. 25, 2021

(86) PCT No.: PCT/JP2021/007165
§ 371 (c)(1),
(2) Date: Oct. 12, 2022

(87) PCT Pub. No.: WO2021/215112
PCT Pub. Date: Oct. 28, 2021

(65) Prior Publication Data
US 2023/0144740 A1     May 11, 2023

(30) Foreign Application Priority Data

Apr. 22, 2020    (JP) ................................. 2020-075949

(51) Int. Cl.
G11C 11/412     (2006.01)
G06F 7/544     (2006.01)
(Continued)

(52) U.S. Cl.
CPC .......... G11C 11/412 (2013.01); G06F 7/5443 (2013.01); G11C 11/54 (2013.01); H10B 10/12 (2023.02)

(58) Field of Classification Search
CPC ..... G11C 11/412; G11C 11/54; G06F 7/5443; G06F 12/00; G06F 17/10; H10B 10/12; Y02D 10/00; G06G 7/60; G06N 3/063
See application file for complete search history.

(56) References Cited

U.S. PATENT DOCUMENTS

| | | | |
|---|---|---|---|
| 5,047,979 A * | 9/1991 | Leung ................... | G11C 11/419 |
| | | | 365/205 |
| 6,385,079 B1 * | 5/2002 | Tran ........................ | G11C 11/15 |
| | | | 365/158 |

(Continued)

FOREIGN PATENT DOCUMENTS

| | | |
|---|---|---|
| JP | 2004-335535 A | 11/2004 |
| JP | 2011-035398 A | 2/2011 |
| JP | 2019-179499 A | 10/2019 |

OTHER PUBLICATIONS

International Search Report and Written Opinion of PCT Application No. PCT/JP2021/007165, issued on Apr. 27, 2021, 08 pages of ISRWO.

*Primary Examiner* — Jay W. Radke
(74) *Attorney, Agent, or Firm* — CHIP LAW GROUP

(57) ABSTRACT

A product-sum calculation with high power efficiency is performed while maintaining a small area of a memory cell. A semiconductor device includes a memory cell array in which a plurality of memory cells are arranged in a matrix. Each memory cell of the plurality of memory cells includes a flip-flop circuit including two inverter circuits in each of which a load field effect transistor and a drive field effect transistor are connected in series, input portions and output portions of the two inverter circuits being cross-joined to each other, two transfer field effect transistors each having a gate electrode connected to a word line, and a pair of first and second main electrode regions, the first main electrode (Continued)

regions being respectively connected to the output portions of the two inverter circuits, and two resistance elements.

3 Claims, 12 Drawing Sheets

(51) Int. Cl.
  *G11C 11/54*          (2006.01)
  *H10B 10/00*          (2023.01)

(56)                    References Cited

U.S. PATENT DOCUMENTS

| | | | |
|---|---|---|---|
| 10,748,602 B2 * | 8/2020 | Liu ....................... | G11C 7/1057 |
| 2007/0127303 A1 * | 6/2007 | Seyyedy ................ | G11C 11/15 |
| | | | 257/E27.005 |
| 2008/0117664 A1 * | 5/2008 | Kinoshita ............ | H10N 70/063 |
| | | | 257/E27.071 |
| 2008/0225590 A1 * | 9/2008 | Lamorey ............ | G11C 14/0081 |
| | | | 365/185.05 |

| | | | |
|---|---|---|---|
| 2008/0229269 A1 * | 9/2008 | Lamorey ............ | G11C 14/0081 |
| | | | 716/126 |
| 2011/0280073 A1 * | 11/2011 | Chiu .................. | G11C 13/0004 |
| | | | 365/185.08 |
| 2012/0020159 A1 * | 1/2012 | Ong ................... | G11C 14/0081 |
| | | | 365/185.08 |
| 2013/0135921 A1 * | 5/2013 | Owada ................. | G11C 11/21 |
| | | | 365/148 |
| 2013/0201754 A1 * | 8/2013 | Yu ..................... | G11C 29/74 |
| | | | 365/158 |
| 2013/0215669 A1 * | 8/2013 | Haukness ......... | G11C 13/0007 |
| | | | 365/148 |
| 2015/0340090 A1 * | 11/2015 | Ma ..................... | G11C 11/1675 |
| | | | 365/148 |
| 2016/0172024 A1 * | 6/2016 | Ma ..................... | G11C 11/5678 |
| | | | 365/148 |
| 2016/0260466 A1 * | 9/2016 | Katayama ............ | G11C 11/161 |
| 2019/0013063 A1 * | 1/2019 | Liu ..................... | G11C 7/1057 |
| 2019/0087719 A1 | 3/2019 | Seo et al. | |
| 2019/0370640 A1 | 12/2019 | Peng et al. | |
| 2020/0126619 A1 * | 4/2020 | Jaiswal ................ | G11C 5/147 |
| 2021/0193912 A1 * | 6/2021 | Gupta ................ | G11C 11/1655 |

* cited by examiner

*FIG. 3*

SEMICONDUCTOR DEVICE

CROSS REFERENCE TO RELATED APPLICATIONS

This application is a U.S. National Phase of International Patent Application No. PCT/JP2021/007165 filed on Feb. 25, 2021, which claims priority benefit of Japanese Patent Application No. JP 2020-075949 filed in the Japan Patent Office on Apr. 22, 2020. Each of the above-referenced applications is hereby incorporated herein by reference in its entirety.

TECHNICAL FIELD

The present technology (the technology according to the present disclosure) relates to a semiconductor device, and particularly relates to a technology effective by being applied to a semiconductor device using a memory cell array unit as a product-sum calculation circuit.

BACKGROUND ART

A complementary MOS (CMOS) circuit including an re-channel conductive metal oxide semiconductor field effect transistor (MOSFET) (hereinafter, referred to as an n-type MOSFET) and a p-channel conductive MOSFET (Hereinafter, referred to as a p-type MOSFET) on the same substrate has low power consumption, is easily miniaturized and highly integrated, and can operate at a high speed, and thus is widely used as many LSI constituent devices. In particular, an LSI having multiple functions mounted on one chip together with an analog circuit and a memory is commercialized as a system on chip (SoC).

Here, a static random access memory (SRAM), which is one of the volatile memories, is mixed in many system on chips from the viewpoint of process affinity with a CMOS with less process addition.

The SRAM performs arithmetic processing in combination with a central processing unit (CPU) as a cache memory, but there is a problem of delay and power consumption between the memory and the CPU. In recent years, a neural network circuit has been put into practical use as an application for authentication of images or patterns. By using a memory array for a product-sum calculation of the neural network circuit, it can be expected to solve the delay and power consumption problem between a memory and a CPU, which is a problem of the Neumann type computing.

Patent Document 1 discloses a product-sum calculation device including a product-sum calculation circuit in which a plurality of synapses in which a nonvolatile variable resistance element and a fixed resistance element are connected in series is arranged in a matrix.

CITATION LIST

Patent Document

Patent Document 1: Japanese Patent Application Laid-Open No. 2019-179499

Patent Document 2: Japanese Patent Application Laid-Open No. 2004-335535 A

Patent Document 3: Japanese Patent Application Laid-Open No. 2011-035398

SUMMARY OF THE INVENTION

Problems to be Solved by the Invention

Incidentally, as an example of product-sum calculation, for example, product-sum computation is performed according to a method of using a resistance (R) as load data, using a voltage (V) as an input, and adding the product $(V \times 1/R) = I$ current (charge amount). As a memory, an SRAM may be applied, but it is necessary to use the SRAM as a resistor corresponding to load data.

As a method of using an SRAM and a resistor, an FET may be connected to an SRAM cell having a normal six-transistor configuration (six MOSFETs), and a channel of the connected FET may be used as a resistor. A circuit in which a plurality of FETs are connected to an SRAM cell having a six-transistor configuration is used as a multi-port SRAM capable of performing parallel reading and simultaneous writing/reading.

In Patent Document 2, two FETs are connected to an SRAM cell having a six-transistor configuration, and in Patent Document 3, four FETs are connected to an SRAM cell having a six-transistor configuration, and parallel reading and simultaneous writing/reading are performed by a plurality of word lines and bit lines. In any circuit configuration, a cell current of 100 μA level is required to increase a speed.

In a case where a MOSFET having a channel resistance with a cell current (Icell) of, for example, the above-described 100 μA level is applied as the resistance (R) in product-sum calculation, a channel resistance of about 1 k to 100 kΩ (kilo-ohm) is obtained by V/Icell (where V is assumed to be about 0.5 V to 3 V). For example, in a case where the product $(V \times 1/R) = I$ current (charge amount) of the resistance (R) and the input voltage (V) in the product-sum calculation is output as a signal, the signal is output as a charge amount stored in load capacitance. In this case, a response speed is output as a time constant (T) of approximately CR, and assuming that load capacitance of cell array is, for example, about 100 fF, T=1 ns is obtained at R=10 kΩ. It is difficult to process a change at a response speed of about 1 ns in a subsequent circuit, for example, a DA converter (DAC), and a resistance of about GΩ (giga-ohm) is required to control the response speed to a level that can be processed by the circuit, for example, to about 1 μs.

Furthermore, in a case where a dendrite line as a summation line is charged with product-sum charge of multiple bits (for example, 1024), a low resistance state (LRS) needs to be sufficiently larger than the dendrite line, and for example, a resistance of 1 MΩ (megaohm) or more is required.

However, in order to achieve such resistance with a MOSFET, it is necessary to set a channel width (W) to 1/1000 or to set a channel length (L) to 1000 times, and an occupied area of a memory cell greatly increases, and thus manufacturing cost is increased.

An object of the present technology is to provide a semiconductor device capable of performing a product-sum calculation with high power efficiency while maintaining a small area of a memory cell.

Solutions to Problems (1) According to an aspect of the present technology, there is provided a semiconductor device including a memory cell array in which a plurality of memory cells is arranged in a matrix. Then, each memory cell of the plurality of memory cells includes a flip-flop circuit including two inverter circuits in each of which a load field effect transistor and a drive field effect transistor are connected in series, input portions and output portions of the two inverter circuits being cross-joined to each other, two transfer field effect transistors each having a gate electrode connected to a word line, and a pair of first and second main electrode regions, the first main electrode regions being respectively connected to the output portions of the two inverter circuits, and two resistance elements of which one end sides are respectively connected to the second main electrode regions of the two transfer field effect transistors and other end sides are respectively connected to a bit line and a bit line bar.

(2) According to another aspect of the present technology, there is provided a semiconductor device including a memory cell array in which a plurality of memory cells are arranged in a matrix. Then, each memory cell of the plurality of memory cells includes a flip-flop circuit including two inverter circuits in each of which a load field effect transistor and a first drive field effect transistor are connected in series, input portions and output portions of the two inverter circuits being cross-joined to each other, two first transfer field effect transistors each having a gate electrode connected to a word line, and a pair of first and second main electrode regions, the first main electrode regions being respectively connected to the output portions of the two inverter circuits, and the second main electrode regions being respectively connected to a bit line and a bit line bar, two second drive field effect transistors each having a gate electrode and a pair of first and second main electrode regions, the gate electrodes being respectively connected to the input portions of the two inverter circuits, and the first main electrode regions being connected to each other, two second transfer field effect transistors each having a gate electrode connected to the word line, and a pair of first and second main electrode regions, the first main electrode regions being respectively connected to the second main electrode regions of the two second drive field effect transistors, and two resistance elements of which one end sides are respectively connected to the second main electrode regions of the two second transfer field effect transistors and other end sides are respectively connected to a dendrite line and a dendrite line bar.

(3) According to still another aspect of the present technology, there is provided a semiconductor device including a memory cell array in which a plurality of memory cells are arranged in a matrix. Then, each memory cell of the plurality of memory cells includes a flip-flop circuit including two inverter circuits in each of which a load field effect transistor and a first drive field effect transistor are connected in series, input portions and output portions of the two inverter circuits being cross-joined to each other, a first transfer field effect transistor having a gate electrode connected to a word line, and a pair of first and second main electrode regions, the first main electrode region being connected to the output portion of the other inverter circuit of the two inverter circuits, and the second main electrode region being connected to a bit line bar, two second drive field effect transistors each having a gate electrode and a pair of first and second main electrode regions, the gate electrodes being respectively connected to the input portions of the two inverter circuits, and the first main electrode regions being connected to each other, two second transfer field effect transistors each having a gate electrode connected to an axon line, and a pair of first and second main electrode regions, the first main electrode regions being respectively connected to the second main electrode regions of the two second drive field effect transistors, and two resistance elements of which one end sides are respectively connected to the second main electrode regions of the two second transfer field effect transistors and other end sides are respectively connected to a dendrite line and a dendrite line bar.

(4) According to still another aspect of the present technology, there is provided a semiconductor device including a memory cell array in which a plurality of memory cells are arranged in a matrix. Then, each memory cell of the plurality of memory cells includes a flip-flop circuit including two inverter circuits in which a load field effect transistor and a first drive field effect transistor are connected in series, input portions and output portions of the two inverter circuits being cross-joined to each other, two first transfer field effect transistors each having a gate electrode connected to a word line, and a pair of first and second main electrode regions, the first main electrode regions being respectively connected to the output portions of the two inverter circuits, and the second main electrode regions being respectively connected to a bit line and a bit line bar, two second drive tunnel field effect transistors each having a gate electrode and a pair of n-type first main electrode region and p-type second main electrode region, the gate electrodes being respectively connected to the input portions of the two inverter circuits, and the n-type first main electrode region being connected to an axon line, and two second transfer tunnel field effect transistors each having a gate electrode connected to the word line, and a pair of n-type first main electrode region and p-type second main electrode region, the p-type second main electrode regions being respectively connected to the p-type second main electrode regions of the two second drive tunnel field effect transistors, and the n-type first main electrode regions being respectively connected to a dendrite line and a dendrite line bar.

BRIEF DESCRIPTION OF DRAWINGS

FIG. 3 is a schematic plan view illustrating a planar pattern of the memory cell in FIG. 1.

MODE FOR CARRYING OUT THE INVENTION

Figure 1:
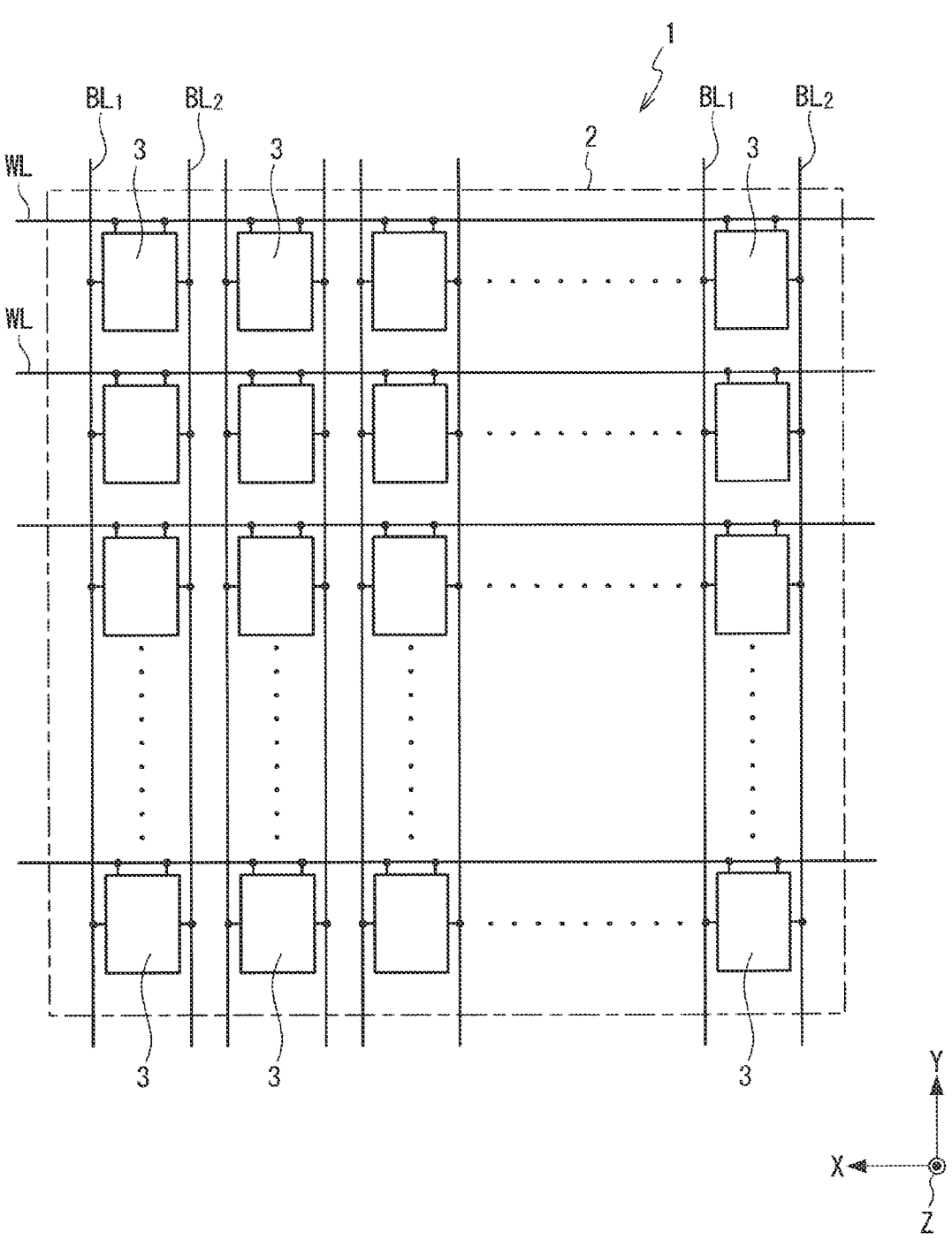
FIG. 1 is a diagram illustrating a schematic configuration of a memory cell array unit of a semiconductor device according to a first embodiment of the present technology.

Hereinafter, embodiments of the present technology will be described in detail with reference to the drawings.

Note that, in all the drawings for describing the embodiments of the present technology, constituents having the same functions are denoted by the same reference numerals, and repeated description thereof will be omitted.

Furthermore, each drawing is schematic and may be different from an actual one. Furthermore, the following embodiments exemplify a device or a method for embodying the technical idea of the present technology, and do not specify the configuration as follows. That is, various modifications can be applied to the technical idea of the present technology within the technical scope described in the claims.

Furthermore, in the following embodiments, in three directions orthogonal to each other in a space, a first direction and a second direction orthogonal to each other in the same plane are defined as an X direction and a Y direction, respectively, and a third direction orthogonal to the first direction and the second direction is defined as a Z direction. In the following embodiments, a thickness direction of a semiconductor layer (semiconductor substrate) will be described as the Z direction.

First Embodiment

In a first embodiment, an SRAM type memory cell including six field effect transistors and two resistance elements will be described.

<<Configuration of Memory Cell Array Unit>>

A semiconductor device 1 according to the first embodiment of the present technology includes a memory cell array unit 2 illustrated in FIG. 1. As illustrated in FIG. 1, in the memory cell array unit 2, a plurality of memory cells 3 are arranged in a matrix on a two-dimensional plane including the X direction and the Y direction. Furthermore, in the memory cell array unit 2, word lines WL extending in the X direction are arranged for each of the memory cells 3 arranged in the Y direction. Furthermore, in the memory cell array unit 2, complementary bit lines (a bit line $BL_1$ and a bit line bar $BL_2$ (BL-)) extending in the Y direction are arranged for each of the memory cells 3 arranged in the X direction. Then, each memory cell 3 of the plurality of memory cells 3 is disposed at an intersection between the corresponding word line WL and the complementary bits ($BL_1$ and $BL_2$).

Here, during a product-sum calculation process (inference in a neural network), the memory cell array unit 2 functions as a product-sum calculation circuit, the word line WL functions as an axon, and the bit line $BL_1$ and the bit line bar $BL_2$ function as a dendrite and a dendrite bar (dendrite-).

<<Configuration of Memory Cell>>

Figure 2:
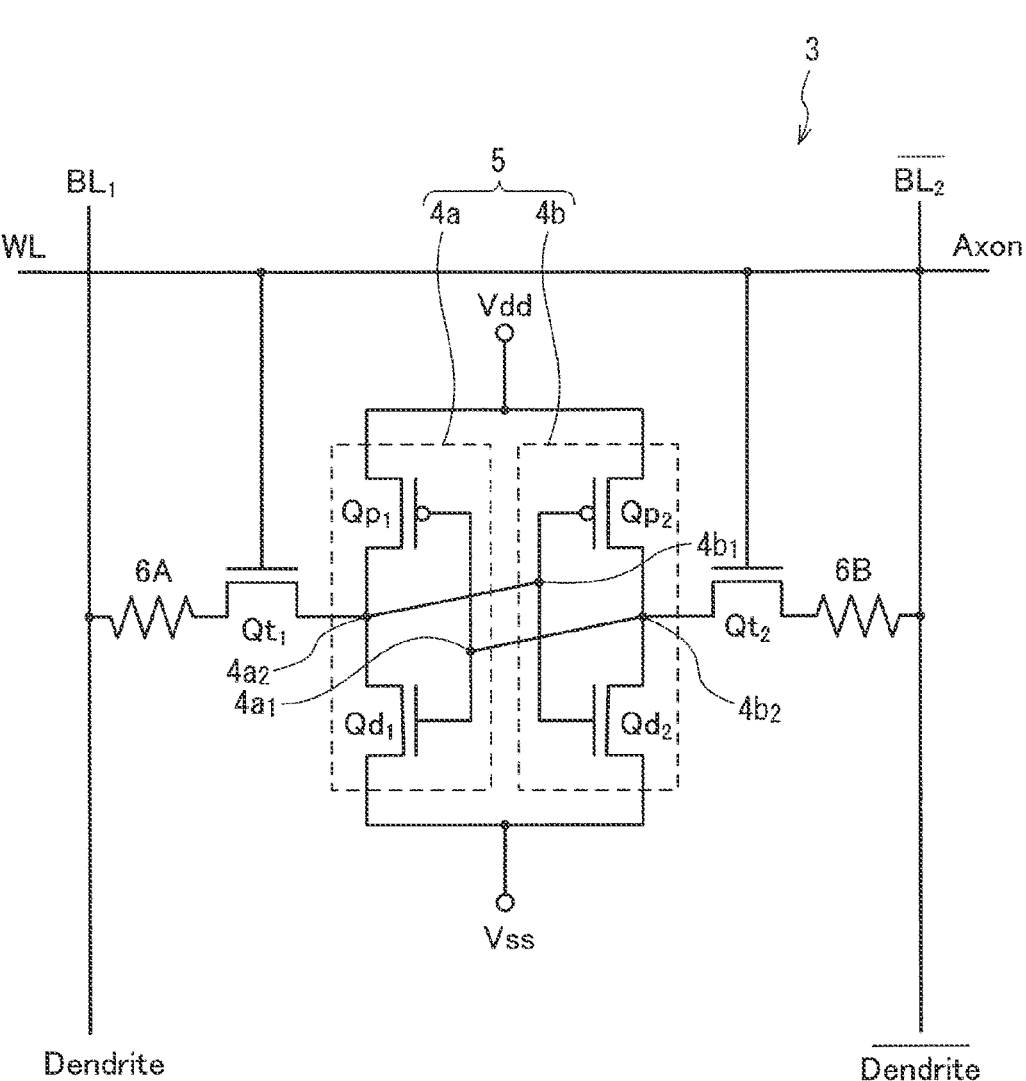
FIG. 2 is an equivalent circuit diagram of the memory cell in FIG. 1.

As illustrated in FIG. 2, each of the plurality of memory cells 3 includes a flip-flop circuit 5, two transfer field effect transistors (transfer gate transistors) $Qt_1$ and $Qt_2$, and two resistance elements 6A and 6B.

The flip-flop circuit 5 includes two inverter circuits 4a and 4b, and has a configuration in which input portions $4a_1$ and $4b_1$ and the output portions (storage node portions) $4a_2$ and $4b_2$ of two inverter circuits 4a and 4b are alternately cross-joined.

One inverter circuit 4a of the two inverter circuits 4a and 4b has a configuration in which a load field effect transistor (pull-up transistor) $Qp_1$ and a drive field effect transistor (pull-down transistor) $Qd_1$ are connected in series. The other inverter circuit 4b has a configuration in which a load field effect transistor $Qp_2$ and a drive field effect transistor $Qd_2$ are connected in series.

The two load field effect transistors $Qp_1$ and $Qp_2$, the two drive field effect transistors $Qd_1$ and $Qd_2$, and the two transfer field effect transistors $Qt_1$ and $Qt_2$ each have a gate insulating film, a gate electrode (control electrode), and a pair of first main electrode region and second main electrode region functioning as a source region and a drain region, and electrical conduction between the first main electrode region and the second main electrode region is controlled by a gate signal input to the gate electrode. Although the field effect transistors $Qp_1$, $Qp_2$, $Qd_1$, $Qd_2$, $Qt_1$, and $Qt_2$ are not limited thereto, for example, the field effect transistors $Qp_1$, $Qp_2$, $Qd_1$, and $Qd_2$ are configured by MOSFETs in which a gate insulating film is a silicon oxide ($SiO_2$) film. Furthermore, as the field effect transistors $Qp_1$, $Qp_2$, $Qd_1$, $Qd_2$, $Qt_1$, and $Qt_2$, a metal insulator semiconductor FET (MISFET) in which a gate insulating film is a silicon nitride ($Si_3N_4$) film or a laminated film such as a silicon nitride film and a silicon oxide film may be used. Hereinafter, the load field effect transistor may be simply referred to as a load FET, the drive field effect transistor may be simply referred to as a drive FET, and the transfer field effect transistor may be simply referred to as a transfer FET.

The two load FETs $Qp_1$ and $Qp_2$ are configured by p-channel conductivity type MOSFETs. On the other hand, the two drive FETs $Qd_1$ and $Qd_2$ and the two transfer FETs $Qt_1$ and $Qt_2$ are configured by n-channel conductivity type MOSFTETs. That is, the memory cell 3 includes a CMOS circuit.

As illustrated in FIG. 2, in the one inverter circuit 4a, the gate electrodes of the load FET $Qp_1$ and the drive FET $Qd_1$ are electrically connected to each other to configure an input portion $4a_1$. Furthermore, the respective first main electrode regions (drain regions) of the load FET $Qp_1$ and the drive FET $Qd_1$ are electrically connected to each other to configure an output portion $4a_2$. Furthermore, the second main electrode region (source region) of the drive FET $Qd_1$ is electrically connected to a ground line $28c_1$ (refer to FIG. 3) to which a Vss potential (for example, 0 V) as a first reference potential is applied. Furthermore, the second main electrode region (source region) of the load FET $Qp_1$ is electrically connected to a power supply line 28d (refer to FIG. 3) to which a Vdd potential (for example, 0.5 V to 1.2 V) as a second reference potential higher than the Vss potential as the first reference potential is applied.

As illustrated in FIG. 2, in the other inverter circuit 4b, the gate electrodes of the load FET $Qp_2$ and the drive FET $Qd_2$ are electrically connected to each other to configure an input portion $4b_1$. The first main electrode regions (drain regions) of the load FET $Qp_2$ and the drive FET $Qd_2$ are electrically connected to each other to configure an output portion $4b_2$. Then, the second main electrode region (source region) of the drive FET $Qd_2$ is also electrically connected to a ground line $28c_2$ (refer to FIG. 3) to which the Vss potential is applied similarly to the drive FET $Qd_1$, and the second main electrode region (source region) of the load FET $Qp_2$ is also electrically connected to the power supply line 18d (refer to FIG. 3) to which the Vdd potential is applied similarly to the load FET $Qp_1$.

As illustrated in FIG. 2, in the two inverter circuits 4a and 4b, the output portion $4a_2$ of one inverter circuit 4a is electrically connected to the input portion $4b_1$ of the other inverter circuit 4b. That is, the first main electrode region (drain region) of each of the load FET $Qp_1$ and the drive FET $Qd_1$ configuring one inverter circuit 4a is electrically connected to the gate electrode of each of the load FET $Qp_2$ and the drive FET $Qd_2$ configuring the other inverter circuit 4b.

Furthermore, the output portion $4b_2$ of the other inverter circuit 4b is electrically connected to the input portion $4a_1$ of the one inverter circuit 4a. That is, the first main electrode region (drain region) of each of the load FET $Qp_2$ and the drive FET $Qd_2$ configuring the other inverter circuit 4b is electrically connected to the gate electrode of each of the load FET $Qp_1$ and the drive FET $Qd_1$ configuring the one inverter circuit 4a.

Note that the respective output portions $4a_2$ and $4b_2$ of the two inverter circuits 4a and 4b configure a storage node portion of the memory cell 3.

In the two transfer FETs $Qt_1$ and $Qt_2$, in one transfer FET $Qt_1$, the gate electrode is electrically connected to the word line WL, and the first main electrode region of the pair of first and second main electrode regions is electrically connected to the output portion $4a_2$ of one inverter circuit 4a. In the other transfer FET $Qt_2$, the gate electrode is electrically connected to the word line WL, and the first main electrode region of the pair of first and second main electrode regions is electrically connected to the output portion $4b_2$ of the other inverter circuit 4b.

As illustrated in FIG. 2, in the two resistance elements 6A and 6B, one resistance element 6A has one end side electrically connected to the second main electrode region of one transfer FET $Qt_1$ and the other end side electrically connected to the bit line $BL_1$. In the other resistance element 6B, one end side is electrically connected to the second main electrode region of the other transfer FET $Qt_2$, and the other end side is electrically connected to the bit line bar $BL_2$.

<<Specific Configuration of Memory Cell>>

Next, a specific configuration of the memory cell 3 will be described in detail with reference to FIGS. 3, 4A, and 4B.

<Configuration of FFT>

Figure 3:
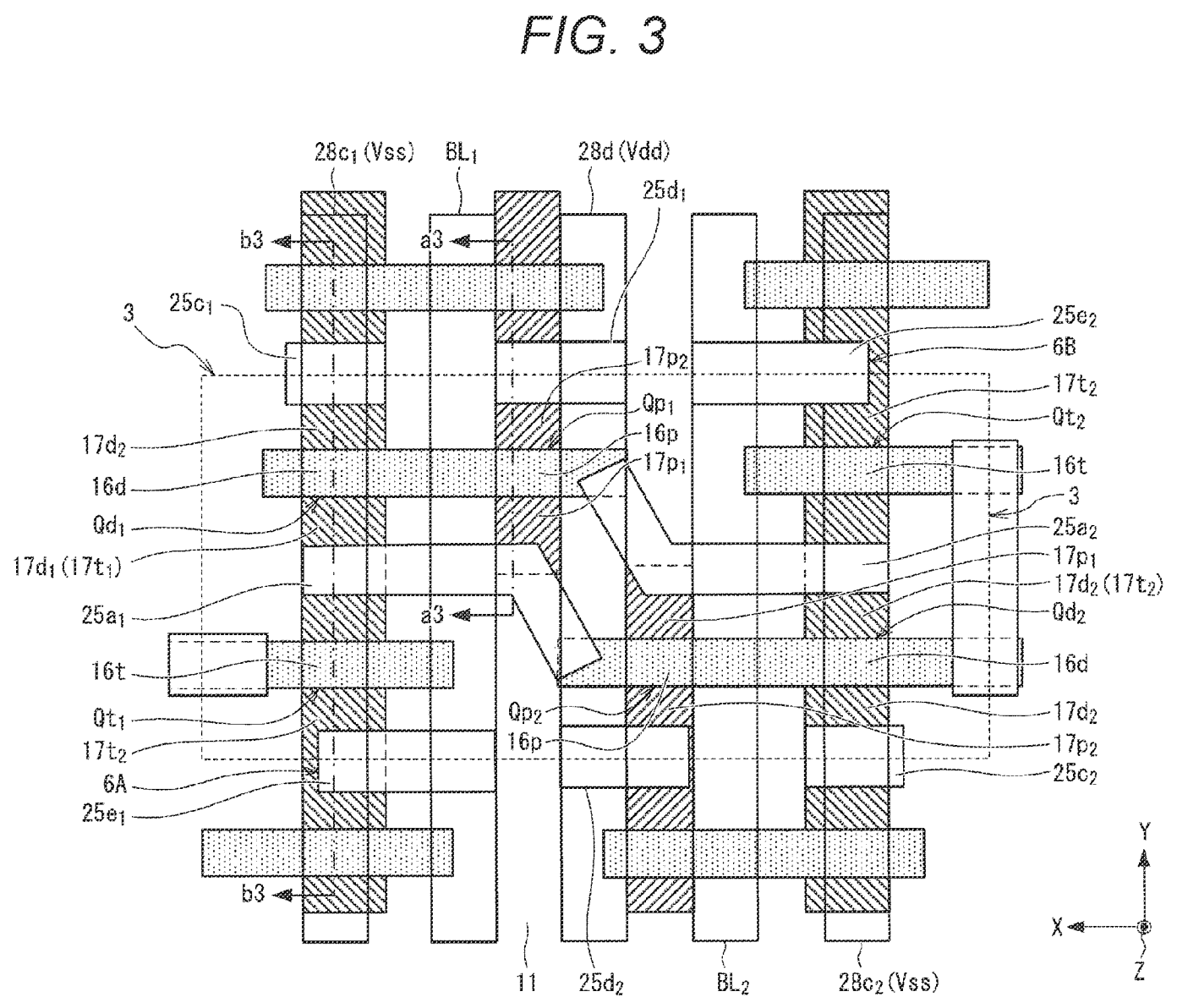
Figure 4A:
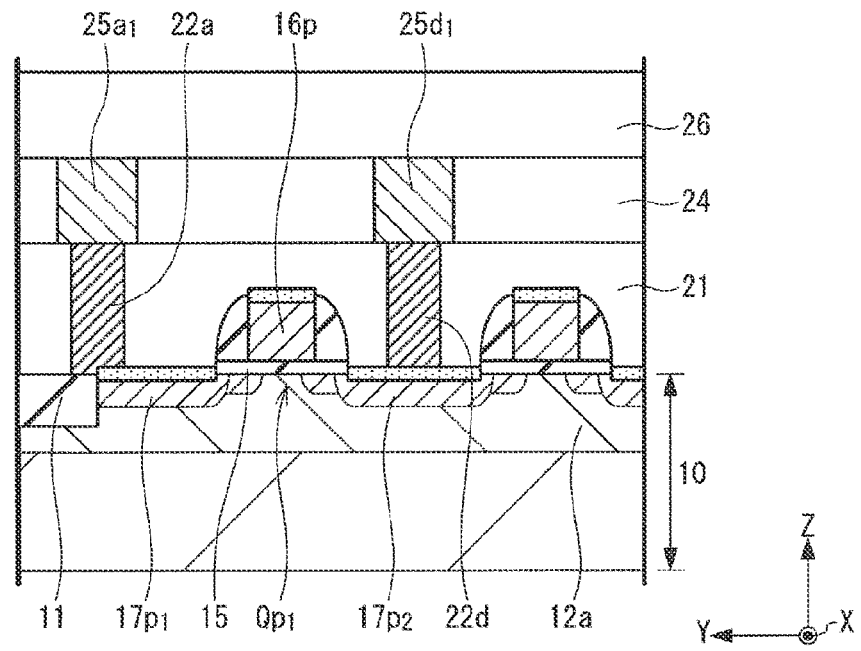
FIG. 4A is a schematic sectional view illustrating a sectional structure taken along the line a3-a3 in FIG. 3.

In the one inverter circuit 4a, as illustrated in FIGS. 3 and 4A, the load FET $Qp_1$ is configured in an n-type well region 12a corresponding to an n-type semiconductor region in an active region partitioned by an isolation region 11 on the main surface of the semiconductor layer 10. The isolation region 11 is not limited thereto, but is configured by, for example, a shallow trench isolation (STI) structure constructed by forming a groove extending in the depth direction from the main surface of the semiconductor layer 10 and selectively burying an insulating film in the groove.

The load FET $Qp_1$ mainly includes a gate insulating film 15 provided on the main surface of the semiconductor layer 10, a gate electrode 16p provided on the gate insulating film 15, and a pair of first main electrode regions $17p_1$ and second main electrode regions $17p_2$ provided in the semiconductor layer 10 to be separated from each other in the channel length direction with a channel formation region immediately below the gate electrode 16p interposed therebetween and functioning as a source region and a drain region. The pair of first and second main electrode regions $17p_1$ and $17p_2$ is provided in the n-type well region 12a.

Figure 4B:
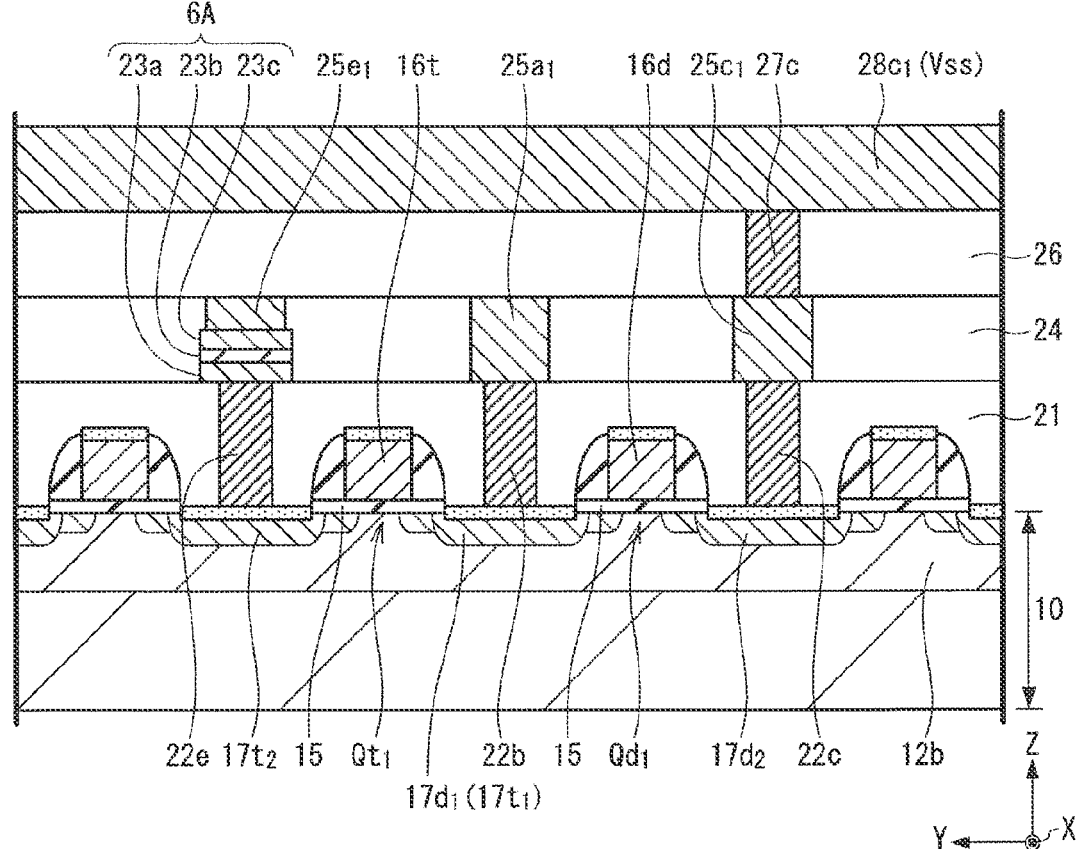
FIG. 4B is a schematic sectional view illustrating a sectional structure taken along the line b3-b3 in FIG. 3.

In the inverter circuit 4a, as illustrated in FIGS. 3 and 4B, the drive FET $Qd_1$ is configured in a p-type well region 12b from a p-type semiconductor region in an active region partitioned by the isolation region 11 on the main surface of the semiconductor layer 10. The drive FET $Qd_1$ mainly includes a gate insulating film 15 provided on the main surface of the semiconductor layer 10, a gate electrode 16d provided on the gate insulating film 15, and a pair of first main electrode region $17d_1$ and second main electrode region $17d_2$ provided in the semiconductor layer 10 to be separated from each other in the channel length direction with a channel formation region immediately below the gate electrode 16d interposed therebetween and functioning as a source region and a drain region. The pair of first and second main electrode regions $17d_1$ and $17d_2$ is provided in the p-type well region 12b.

As illustrated in FIGS. 3 and 4B, one transfer FET $Qt_1$ is configured in a p-type well region 12b in an active region defined by the isolation region 11 on the main surface of the semiconductor layer 10. One transfer FET $Qt_1$ mainly includes a gate insulating film 15 provided on the main surface of the semiconductor layer 10, a gate electrode 16t provided on the gate insulating film 15, and a pair of first main electrode region $17t_1$ and second main electrode region $17t_2$ provided in the semiconductor layer 10 to be separated from each other in the channel length direction with a channel formation region immediately below the gate electrode 16t interposed therebetween and functioning as a source region and a drain region. The pair of first and second main electrode regions $17t_1$ and $17t_2$ is provided in the p-type well region 12b. The transfer FET $Qt_1$ and the drive FET $Qd_1$ have a structure in which the respective first main electrode regions $17t_1$ and $17d_1$ are made common (shared).

The semiconductor layer 10 is configured with, for example, a p-type semiconductor substrate including single crystal silicon. The gate insulating film 15 is configured with, for example, a silicon oxide ($SiO_2$) film. The gate electrodes 16p, 16d, and 16t are configured with, for example, a composite film in which a silicide film is laminated on a polycrystalline silicon film into which an impurity for reducing a resistance value is introduced.

The pair of first and second main electrode regions $17p_1$ and $17p_2$ includes, for example, an extension region including a p-type semiconductor region, a contact region including a p-type semiconductor region having a higher impurity concentration than that of the extension region, and a silicide film provided on the contact region. The pair of first and second main electrode regions $17d_1$ and $17d_2$ and the pair of first and second main electrode regions $17t_1$ and $15t_2$ include, for example, an extension region including an n-type semiconductor region, a contact region including an n-type semiconductor region having a higher impurity concentration than that of the extension region, and a silicide film provided on the contact region.

As illustrated in FIGS. 4A and 4B, each of the load FET $Qp_1$, the drive FET $Qd_1$, and the transfer FET $Qt_1$ is covered with an interlayer insulating film 21 provided on the semiconductor layer 10.

In the other inverter circuit 4b, the transfer FET $Qt_2$ has a configuration similar to that of the above-described transfer FET $Qt_1$, and the drive FET $Qd_2$ has a configuration similar to that of the above-described drive FET $Qd_1$. Then, the other transfer FET $Qt_2$ has a configuration similar to that of the above-described transfer FET $Qt_1$. Therefore, a description of specific configurations of the load FET $Qp_2$, the drive FET $Qd_2$, and the transfer FET $Qt_2$ will be omitted.

Furthermore, each of the load FETs $Qp_1$ and $Qp_2$, the drive FETs $Qd_1$ and $Qd_2$, and the transfer FETs $Qt_1$ and $Qt_2$ is configured by, for example, a lightly doped drain (LDD)

structure and a self-aligned silicide (SALICIDE) structure, but a description of a specific configuration thereof will also be omitted.

Note that the load FET $Qp_2$, the drive FET $Qd_2$, and the transfer FET $Q_2$ are also covered with the interlayer insulating film 21.

<Configuration of Resistance Element>

As illustrated in FIG. 4B, one resistance element 6A is buried in an interlayer insulating film 24 provided on the interlayer insulating film 21. The resistance element 6A has, not limited to, a metal insulator metal (MIM) structure in which, for example, a first electrode 23a on one end side, an insulating film 23b, and a second electrode 23c on the other end side are laminated in this order from the semiconductor layer 10 side. As each of the first electrode 23a and the second electrode 23c, for example, a high melting point metal compound film such as a titanium nitride (TiN) film or a tantalum nitride (TaN) film may be used. As the insulating film 23b, for example, a silicon oxide ($SiO_2$) film, an aluminum oxide ($AlO_2$) film, a magnesium oxide ($MgO_2$) film, a hafnium oxide ($HfO_2$) film, or a zirconium oxide ($ZrO_2$) film having a film thickness of about 1 to 3 nm can be used.

The other resistance element 6B has a configuration similar to that of the above-described resistance element 6A. Therefore, a description of a specific configuration of the other resistance element 6B will be omitted.

The two resistance elements 6A and 6B can obtain a desired resistance value with a small area. For example, the resistance elements 6A and 6B can form a resistance value of 1 MΩ or more, which is necessary in a case where a bit line as a summation line is charged with product-sum charge for multiple bits (for example, 1024), within an occupied area of the memory cell 3 during a product-sum calculation process. Moreover, since the resistance elements 6A and 6B are disposed on the transfer FETs $Qt_1$ and $Qt_2$, in other words, disposed to overlap the transfer FETs $Qt_1$ and $Qt_2$ in a plan view (refer to FIGS. 3 and 4B), an increase in the planar size of the memory cell 3 can be suppressed. That is, the memory cell 3 of the first embodiment includes the two resistance elements 6A and 6B while maintaining a small area necessary for arrangement of six FETs ($Q_1$, $Qp_2$, $Qd_1$, $Qd_2$, $Qt_1$, and $Qt_2$).

A resistance value of each of the two resistance elements 6A and 6B is preferably larger than a channel resistance value of the transfer FETs $Qt_1$ and $Qt_2$, and more preferably 1 MΩ or more.

<Configuration of One Inverter Circuit>

As illustrated in FIG. 3, the gate electrodes 16p and 16d of the load FET $Qp_1$ and the drive FET $Qd_1$ configuring one inverter circuit 4a are integrally molded and electrically connected to each other. That is, the respective gate electrodes 16p and 16d of the load FET $Qp_1$ and the drive FET $Qd_1$ are connected to each other to configure the input portion $4a_1$ (refer to FIG. 2).

As illustrated in FIGS. 3 and 4A, the first main electrode region $17p_1$ of the load FET $Qp_1$ is electrically connected to a relay wiring $25a_1$ formed in a first wiring layer on the interlayer insulating film 21 via a conductive plug 22a buried in the interlayer insulating film 21 on the semiconductor layer 10. On the other hand, as illustrated in FIGS. 3 and 4B, the respective first main electrode regions $17d_1$ and $17t_1$ of the drive FET $Qd_1$ and the transfer FET $Qt_1$ are electrically connected to the relay wiring $25a_1$ via a conductive plug 22b buried in the interlayer insulating film 21 on the semiconductor layer 10. That is, the respective first main electrode regions $17p_1$, $17d_1$, and $17t_1$ of the load FET $Qp_1$, the drive FET $Qd_1$, and the transfer FET $Qt_1$ are electrically connected to each other to configure the output portion $4a_2$ (refer to FIG. 2). The relay wiring $25a_1$ and relay wirings $25c_1$ to $25e_1$ that will be described later are buried in an interlayer insulating film 24 on the interlayer insulating film 21.

As illustrated in FIGS. 3 and 4B, the second main electrode region $17d_2$ of the drive FET $Qd_1$ is electrically connected to the relay wiring $25c_1$ formed in the first wiring layer via a conductive plug 22c buried in the interlayer insulating film 21. Then, the relay wiring $25c_1$ is electrically connected to a ground wiring $28c_1$ formed in a second wiring layer on the interlayer insulating film 26 and extending in the Y direction via a conductive plug 27c buried in the interlayer insulating film 26 on the interlayer insulating film 24. The Vss potential as the above-described first reference potential is applied to the ground wiring $28c_1$. That is, Vss potential is supplied from the ground wire $28c_1$ to the second main electrode region $17d_2$ of the drive FET $Qd_1$.

As illustrated in FIGS. 3 and 4A, the second main electrode region $17p_2$ of the transfer FET $Qp_1$ is electrically connected to the relay wiring $25d_1$ formed in the first wiring layer via a conductive plug 22d buried in the interlayer insulating film 21. Then, although not illustrated in detail, the relay wiring $25d_1$ is electrically connected to the power supply line 28d formed in the second wiring layer on the interlayer insulating film 26 and extending in the Y direction via the conductive plug buried in the interlayer insulating film 26. The Vdd potential as the above-described second reference potential is applied to the power supply line 28d. That is, the Vdd potential is supplied from the power supply line 28d to the second main electrode region $17p_2$ of the load FET $Qp_1$.

As illustrated in FIGS. 3 and 4B, the second main electrode region $17t_2$ of the transfer FET $Qt_1$ is electrically connected to the first electrode 23a of the resistance element 6A via a conductive plug 22e buried in the interlayer insulating film 21. Then, the second electrode 23c of the resistance element 6A is electrically and mechanically connected to the relay wiring $25e_1$ formed in the first wiring layer. Then, although not illustrated in detail, the relay wiring $25e_1$ is electrically connected to the bit line $BL_1$ (dendrite) formed in the second wiring layer on the interlayer insulating film 26 and extending in the Y direction via the conductive plug buried in the interlayer insulating film 26.

<Other Inverter Circuit>

As illustrated in FIG. 3, the respective gate electrodes 16p and 16d of the load FET $Qp_2$ and the drive FET $Qd_2$ configuring the other inverter circuit 4b are integrally molded and electrically connected to each other. That is, the respective gate electrodes 16p and 16d of the load FET $Qp_2$ and the drive FET $Qd_2$ are connected to each other to configure the input portion $4b_1$ (refer to FIG. 2).

As illustrated in FIG. 3, although not illustrated in detail, the first main electrode region $17p_2$ of the load FET $Qp_2$ is electrically connected to the relay wiring $25a_2$ formed in the first wiring layer on the interlayer insulating film 21 via the conductive plug buried in the interlayer insulating film 21 on the semiconductor layer 10, similarly to that of the above-described load FET $Qp_1$. On the other hand, although not illustrated in detail, the respective first main electrode regions $17d_1$ and $17t_1$ of the drive FET $Qd_2$ and the transfer FET $Qt_2$ are electrically connected to the relay wiring $25a_2$ via the conductive plug buried in the interlayer insulating film 21 on the semiconductor layer 10, similarly to those of the drive FET $Qd_1$ and the transfer FET $Qt_1$ described above.

That is, the respective first main electrode regions $17p_1$, $17d_1$, and $17t_1$ of the load FET $Qp_2$, the drive FET $Qd_2$, and the transfer FET $Qt_2$ are electrically connected to each other to configure the output portion $4b_2$ (refer to FIG. 2). The relay wiring $25a_2$ and the relay wiring $25c_2$ to $25e_2$ that will be described later are buried in the interlayer insulating film 24 on the interlayer insulating film 21.

As illustrated in FIG. 3, although not illustrated in detail, the second main electrode region $17d_2$ of the drive FET $Qd_2$ is electrically connected to the relay wiring $25c_2$ formed in the first wiring layer via the conductive plug buried in the interlayer insulating film 21, similarly to that of the above-described drive FET $Qd_1$. Then, the relay wiring $25c_2$ is electrically connected to the ground wiring $28c_2$ formed in the second wiring layer on the interlayer insulating film 26 and extending in the Y direction via the conductive plug buried in the interlayer insulating film 26 on the interlayer insulating film 24. The Vss potential (for example, 0 V) as the above-described first reference potential is applied to the ground wiring $28c_2$. That is, the Vss potential is supplied from the ground wire $28c_2$ to the second main electrode region $17d_2$ of the drive FET $Qd_2$.

As illustrated in FIG. 3, although not illustrated in detail, the second main electrode region $17p_2$ of the load FET $Qp_2$ is electrically connected to the relay wiring $25d_2$ formed in the first wiring layer via the conductive plug buried in the interlayer insulating film 21, similarly to that of the above-described load field effect transistor $Qp_1$. Then, the relay wiring $25d_2$ is electrically connected to the power supply line $28d$ formed in the second wiring layer on the interlayer insulating film 26 and extending in the Y direction via the conductive plug buried in the interlayer insulating film 26. That is, the Vdd potential is supplied from the power supply line $28d$ to the second main electrode region $17p_2$ of the load FET $Qp_2$.

As illustrated in FIG. 3, although not illustrated in detail, the second main electrode region $17t_2$ of the transfer FET $Qt_2$ is electrically connected to the first electrode $23a$ of the resistance element 6B via the conductive plug buried in the interlayer insulating film 21, similarly to that of the above-described transfer FET $Qt_1$. Then, the second electrode $23c$ of the resistance element 6B is electrically and mechanically connected to the relay wiring $25e_2$ formed in the first wiring layer. Then, the relay wiring $25e_2$ is electrically connected to the bit line bar $BL_2$ (dendrite-) formed in the second wiring layer on the interlayer insulating film 26 and extending in the Y direction via the conductive plug buried in the interlayer insulating film 26.

<Two Inverter Circuits>

As illustrated in FIG. 3, although not illustrated in detail, the gate electrode $16p$ of the load FET $Qp_1$ is electrically connected to the relay wiring $25a_2$ via the conductive plug buried in the interlayer insulating film 21. That is, the respective gate electrodes $16p$ and $16d$ of the load FET $Qp_1$ and the drive FET $Qd_1$ configuring the one inverter circuit $4a$ are electrically connected to the respective first main electrode regions $17p_1$ and $17d_1$ of the load FET $Qp_2$ and the drive FET $Qd_2$ configuring the other inverter circuit $4b$ and the first main electrode region $17t_1$ of the other transfer FET $Qt_2$.

As illustrated in FIG. 3, although not illustrated in detail, the gate electrode $16p$ of the load FET $Qp_2$ is electrically connected to the relay wiring $25a_1$ via the conductive plug buried in the interlayer insulating film 21. That is, the respective gate electrodes $16p$ and $16d$ of the load FET $Qp_2$ and the drive FET $Qd_2$ configuring the other inverter circuit $4b$ are electrically connected to the respective first main electrode regions $17p_1$ and $17d_1$ of the load FET $Qp_1$ and the drive FET $Qd_1$ configuring the one inverter circuit $4a$ and the first main electrode region $17t_1$ of the one transfer FET $Qt_1$.

Note that, although not illustrated in FIG. 3, the respective gate electrodes $16p$ and $16d$ of the two transfer FETs $Qt_1$ and $Qt_2$ are electrically connected to the word line WL extending in the X direction. The word line WL is formed, for example, in a third wiring layer provided on the second wiring layer via the interlayer insulating film.

<<Write Operation and Product-Sum Calculation>>

Next, an operation of writing data to the memory cell 3 and a product-sum calculation will be described.

As a write operation to the memory cell 3, by applying the Vcc potential (for example, 1 V) to the word line WL to turn on the two transfer FETs $Qt_1$ and $Qt_2$, and setting the bit line $BL_1$ to the Vdd potential and the bit line bar $BL_2$ to the Vss potential, the output portion (storage node portion) $4a_2$ of one inverter circuit $4a$ is set to the Vcc potential and the output portion (storage node portion) $4b_2$ of the other inverter circuit $4b$ is set to the Vss potential. Even if the word line WL is set to the Vss potential, the flip-flop circuit 5 including the two inverter circuits $4a$ and $4b$ is stabilized.

On the other hand, at the time of a product-sum calculation (inference) using the memory cell array unit 2 as a product-sum calculation circuit, the bit line $BL_1$ as a dendrite and the bit line bar $BL_2$ as a dendrite bar (dendrite-) are precharged to the Vcc potential (for example, 1 V) in a state in which the flip-flop circuit 5 of the memory cell 3 stores data. Subsequently, a signal (for example, a pulse voltage) is sequentially input to the word line WL as an axon or to the plurality of word lines WL. When the signal reaches the Vcc potential, the respective transfer FETs $Qt_1$ and $Qt_2$ of the two inverter circuits $4a$ and $4b$ are turned on, and the drive FET $Qd_2$ of the other inverter circuit $4b$ having the gate electrode $16d$ connected to the output portion (storage node portion) $4a_2$ of the one inverter circuit $4a$ is turned on. Therefore, the charge of the bit line bar $BL_2$ is released toward the Vss potential, and the potential decreases. On the other hand, since the drive FET $Qd_1$ of one inverter circuit $4a$ in which the gate electrode $16d$ is connected to the output portion $4b_2$ of the other inverter circuit $4b$ is in an OFF state, the charge of the bit line $BL_1$ is not released, and the potential does not change.

Here, the potential of the bit line bar $BL_2$ (dendrite-) changes with the CR time constant of the resistance value R of the resistance element 6B and the parasitic capacitance C parasitic on the bit line bar $BL_2$. Therefore, by outputting or AD-converting a potential difference between the bit line $BL_1$ (dendrite) and the bit line bar $BL_2$ (dendrite-) in response to the CR time constant, the sum-product calculation with high power efficiency can be performed.

Note that the input potential to the word line WL, that is, the axon at the time of the sum-product calculation can be freely set separately from the Vcc potential or a write potential applied to the word WL at the time of writing data to the memory cell 3. In a case where the conductance of the load FETs $Qp_1$ and $Qp_2$ is greater than the conductance of the resistance elements 6A and 6B, writing of data to the memory cell 3 is performed by cutting off the Vcc potential or the Vss potential.

Main Effects of First Embodiment

As described above, the memory cell 3 of the semiconductor device 1 according to the first embodiment includes the flip-flop circuit 5, and the two transfer FETs $Qt_1$ and $Qt_2$, and further includes the two resistance elements 6A and 6B.

Then, each of the two resistance elements 6A and 6B has a resistance value of 1 MΩ or more, which is necessary in a case where a bit line as a summation line is charged with product-sum charge for multiple bits (for example, 1024), during the product-sum calculation process, and is disposed within an occupied area of the memory cell 3. Therefore, according to the semiconductor device 1 of the first embodiment, it is possible to perform a product-sum calculation with high power efficiency while maintaining a small area of the memory cell 3.

Second Embodiment

In a second embodiment, an SRAM-type memory cell including ten field effect transistors and two resistance elements will be described.

<<Configuration of Memory Cell Array Unit>>

Figure 5:
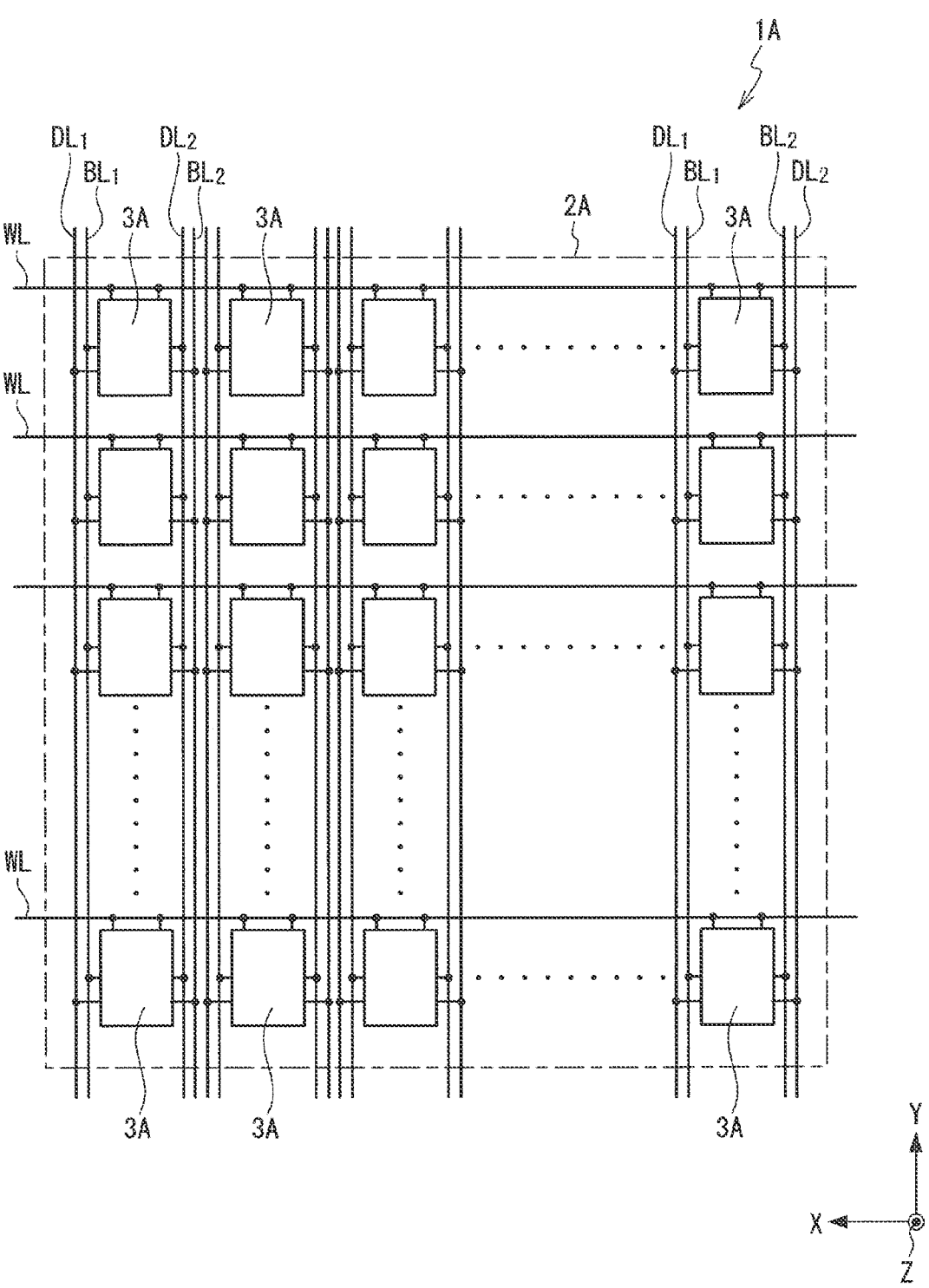
FIG. 5 is a diagram illustrating a schematic configuration of a memory cell array unit of a semiconductor device according to a second embodiment of the present technology.

A semiconductor device 1A according to the second embodiment includes a memory cell array unit 2A illustrated in FIG. 5. As illustrated in FIG. 5, in the memory cell array unit 2A, a plurality of memory cells 3A are arranged in a matrix on a two-dimensional plane including the X direction and the Y direction. Furthermore, in the memory cell array unit 2A, word lines WL extending in the X direction are arranged for each of memory cells 3A arranged in the Y direction. Furthermore, in the memory cell array unit 2A, complementary bit lines (a bit line $BL_1$ and a bit line bar $BL_2$ (BL-)) extending in the Y direction are arranged for each of the memory cells 3A arranged in the X direction. Furthermore, in the memory cell array unit 2A, complementary dendrite lines (dendrite line $DL_1$ and dendrite line bar (dendrite line-) $DL_2$) extending in the Y direction are arranged for each of the memory cells 3A arranged in the X direction. Then, each memory cell 3A of the plurality of memory cells 3A is disposed at an intersection between the corresponding word line WL and the complementary bit lines ($BL_1$ and $BL_2$) and complementary dendrite lines ($DL_1$ and $DL_2$).

Here, during a product-sum calculation process (inference in a neural network), the memory cell array unit 2A functions as a product-sum calculation circuit, the word line WL functions as an axon, and the dendrite line $DL_1$ and the dendrite line bar $DL_2$ function as a dendrite and a dendrite bar (dendrite-).

<<Configuration of Memory Cell>>

Figure 6:
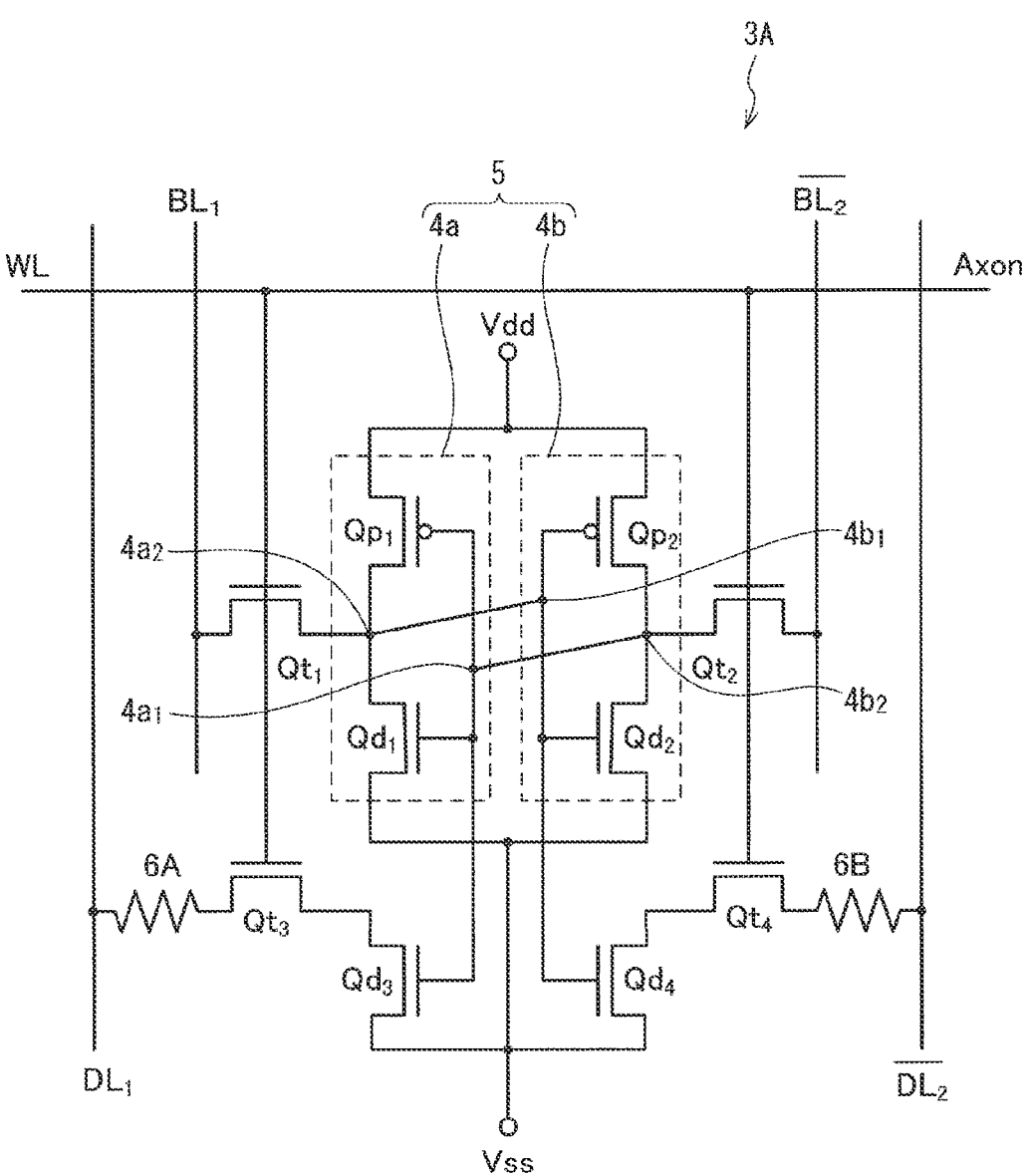
FIG. 6 is an equivalent circuit diagram of the memory cell in FIG. 5.

As illustrated in FIG. 6, each memory cell 3A of the plurality of memory cells 3A includes a flip-flop circuit 5, two transfer FETs $Qt_1$ and $Qt_2$ as first transfer field effect transistors, two transfer FETs $Qt_3$ and $Qt_4$ as second transfer field effect transistors, two drive FETs $Qd_3$ and $Qd_4$ as second drive field effect transistors, and two resistance elements 6A and 6B.

The flip-flop circuit 5 includes two inverter circuits 4a and 4b, and has a configuration in which input portions $4a_1$ and $4b_1$ and the output portions (storage node portions) $4a_2$ and $4b_2$ of two inverter circuits 4a and 4b are alternately cross-joined.

One inverter circuit 4a of the two inverter circuits 4a and 4b has a configuration in which a load FET (pull-up transistor) $Qp_1$ and a drive FET (pull-down transistor) $Qd_1$ as a first drive field effect transistor are connected in series. Furthermore, the other inverter circuit 4b has a configuration in which a load FET $Qp_2$ and a drive FET $Qd_2$ as a first drive field effect transistor are connected in series.

Similarly to the two drive FETs $Qd_1$ and $Qd_2$ and the two transfer FETs $Qt_1$ and $Qt_2$, the two drive FETs $Qd_3$ and $Qd_4$ and the two transfer FETs $Qt_3$ and $Qt_4$ include a gate insulating film, a gate electrode (control electrode), and a pair of first main electrode region and second main electrode region functioning as a source region and a drain region, and electrical conduction between the first main electrode region and the second main electrode region is controlled by a gate signal input to the gate electrode. Then, the FETs $Qd_3$, $Qd_4$, $Qt_3$, and $Qt_4$ are also configured by n-channel conductivity type MOSFETs, for example.

As illustrated in FIG. 6, in one transfer FET $Qt_1$ of the two transfer FETs $Qt_1$ and $Qt_2$, similarly to the transfer FET $Qt_1$ of the first embodiment described above, the gate electrode is electrically connected to the word line WL, and the first main electrode region of the pair of first and second main electrode regions is electrically connected to the output portion $4a_2$ of one inverter circuit 4a. Then, unlike the transfer FET $Qt_1$ of the first embodiment described above, the second main electrode region of one transfer FET $Qt_1$ is electrically connected to the bit line $BL_1$ without passing through the resistance element 6A.

As illustrated in FIG. 6, in the other transfer FET $Qt_2$ of the two transfer FETs $Qt_1$ and $Qt_2$, similarly to the transfer FET $Qt_2$ of the first embodiment described above, the gate electrode is electrically connected to the word line WL, and the first main electrode region of the pair of first and second main electrode regions is electrically connected to the output portion $4b_2$ of the other inverter circuit 4b. Then, in the other transfer FET $Qt_2$, unlike the transfer FET $Qt_2$ of the first embodiment described above, the second main electrode region is electrically connected to the bit line bar $BL_2$ without passing through the resistance element 6B.

As illustrated in FIG. 6, one drive FET $Qd_3$ of the two drive FETs $Qd_3$ and $Qd_4$ has a gate electrode electrically connected to the gate electrode of each of the load FET $Qp_1$ and the drive FET $Qd_1$ configuring one inverter circuit 4a. That is, the gate electrode of the one drive FET $Qd_3$ is electrically connected to the input portion $4a_1$ of the one inverter circuit 4a.

As illustrated in FIG. 6, the other drive FET $Qd_4$ of the two drive FETs $Qd_3$ and $Qd_4$ has a gate electrode electrically connected to the gate electrode of each of the load FET $Qp_2$ and the drive FET $Qd_2$ configuring the other inverter circuit 4b. That is, the gate electrode of the other drive FET $Qd_4$ is electrically connected to the input portion $4b_1$ of the other inverter circuit 4b.

As illustrated in FIG. 6, the first main electrode region of each of the two drive FETs Qd3 and Qd4 is electrically connected to the ground wiring to which the Vss potential as a first reference potential is applied.

As illustrated in FIG. 6, in one transfer FET $Qt_3$ of the two transfer FETs $Qt_3$ and $Qt_4$, the gate electrode is electrically connected to the word line WL, and the first main electrode region of the pair of first and second main electrode regions is electrically connected to the second main electrode region of the drive FET $Qd_3$. Then, in the one transfer FET $Qt_3$, the second main electrode region is electrically connected to the first electrode on one end side of the resistance element 6A. Then, the second main electrode on the other end side of the resistance element 6A is electrically connected to the dendrite line $DL_1$.

As illustrated in FIG. 6, in the other transfer FET $Qt_4$ of the two transfer FETs $Qt_3$ and $Qt_4$, the gate electrode is electrically connected to the word line WL, and the first main electrode region of the pair of first and second main electrode regions is electrically connected to the second main electrode region of the drive FET $Qd_4$. Then, in the other transfer FET $Qt_4$, the second main electrode region is electrically connected to the first electrode on one end side of the resistance element 6B. Then, the second main electrode on the other end side of the resistance element 6B is electrically connected to the dendrite line bar (dendrite line-) $DL_2$.

Although not illustrated, the dendrite line $DL_1$ and the dendrite line bar $DL_2$ are formed in the second wiring layer and extend in the Y direction, for example, similarly to the bit line $BL_1$ and the bit line bar $BL_2$.

The two resistance elements 6A and 6B of the second embodiment also have an MIM structure similarly to the resistance elements 6A and 6B of the first embodiment described above, can obtain a desired resistance value with a small area, and are arranged within an occupied area of the memory cell. Then, a resistance value of each of the two resistance elements 6A and 6B is preferably larger than a channel resistance value of the transfer FETs $Qt_3$ and $Qt_4$, and more preferably 1 MΩ or more.

<<Write Operation and Product-Sum Calculation>>

Next, an operation of writing data to the memory cell 3A and a product-sum calculation will be described.

As a write operation to the memory cell 3A, by applying the Vcc potential (for example, 1 V) to the word line WL to turn on the two transfer FETs $Qt_1$ and $Qt_2$ and setting the bit line $BL_1$ to the Vcc potential and the bit line bar $BL_2$ to the Vss potential, the output portion (storage node portion) $4a_2$ of one inverter circuit 4a is set to the Vcc potential and the output portion (storage node portion) $4b_2$ of the other inverter circuit 4b is set to the Vss potential. Even if the word line WL is set to the Vss potential, the flip-flop circuit 5 including the two inverter circuits 4a and 4b is stabilized.

On the other hand, at the time of a product-sum calculation (inference) using the memory cell array unit 2A as a product-sum calculation circuit, the dendrite line $DL_1$ and the dendrite line bar $DL_2$ are precharged to the Vcc potential (for example, 1 V) in a state in which the flip-flop circuit 5 of the memory cell 3A stores data. Subsequently, a signal (for example, a pulse voltage) is sequentially input to the word line WL as an axon or to the plurality of word lines WL. When the signal reaches the Vcc potential, the two transfer FETs Qt3 and Qt4 are turned on, and the other drive FET $Qd_4$ having the gate electrode connected to the output portion (storage node portion) $4a_2$ of the one inverter circuit 4a is turned on. Therefore, the charge of the dendrite line bar $DL_2$ is released toward the Vss potential, and the potential decreases. On the other hand, since one drive FET $Qd_3$ having the gate electrode connected to the output portion $4b_2$ of the other inverter circuit 4b is in an OFF state, the charge of the dendrite line $DL_1$ is not released, and the potential does not change.

Here, the potential of the dendrite line bar $DL_2$ (dendrite line-) changes with the CR time constant of the resistance value R of the resistance element 6B and the parasitic capacitance C parasitic on the dendrite line bar $DL_2$. Therefore, by outputting or AD-converting a potential difference between the dendrite line $DL_1$ and the dendrite line bar $DL_2$ (dendrite line-) in response to the CR time constant, the sum-product calculation with high power efficiency can be performed.

Note that the input potential to the word line WL, that is, the axon at the time of the sum-product calculation can be freely set separately from the Vcc potential or a write potential applied to the word line WL at the time of writing data to the memory cell 3A. Writing of data into the flip-flop circuit 5 of the memory cell 3A is usually performed at a high speed through an SRAM operation. The current consumption can be reduced by reducing the Vcc potential during the SRAM operation and increasing a threshold voltage Vth of each of the load FETs $Qp_1$ and $Qp_2$ and the drive FTEs $Qd_1$ and $Qd_2$.

Main Effects of Second Embodiment

As described above, the memory cell 3A of the semiconductor device 1A according to the second embodiment includes the flip-flop circuit 5, the four transfer FETs $Qt_1$, $Qt_2$, $Qt_3$, and $Qt_4$, and the two drive FETs $Qd_3$ and $Qd_4$, and further includes the two resistance elements 6A and 6B. Then, each of the two resistance elements 6A and 6B has a resistance value of 1 MΩ or more, which is necessary in a case where a bit line as a summation line is charged with product-sum charge for multiple bits (for example, 1024), during the product-sum calculation process, and is disposed within an occupied area of the memory cell 3A. Therefore, according to the semiconductor device 1A of the first embodiment, similarly to the semiconductor device 1 of the first embodiment described above, it is possible to perform a product-sum calculation with high power efficiency while maintaining a small area of the memory cell 3A.

Third Embodiment

In a third embodiment, an SRAM-type memory cell including nine field effect transistors and two resistance elements will be described.

<<Configuration of Memory Cell Array Unit>>

Figure 7:
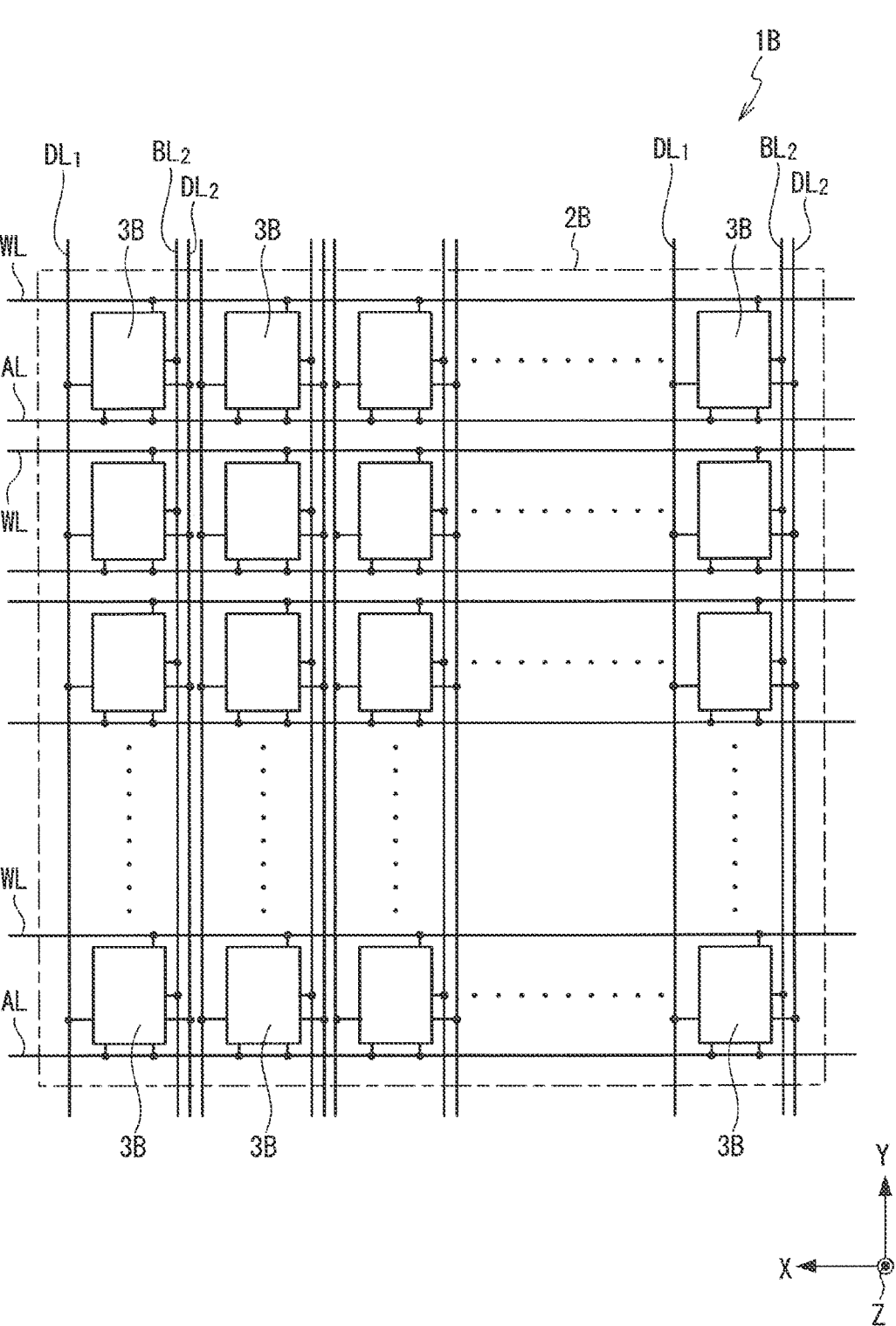
FIG. 7 is a diagram illustrating a schematic configuration of a memory cell array unit of a semiconductor device according to a third embodiment of the present technology.

The semiconductor device 1B according to the third embodiment includes a memory cell array unit 2B illustrated in FIG. 7. As illustrated in FIG. 7, in the memory cell array unit 2B, a plurality of memory cells 3B is arranged in a matrix on a two-dimensional plane including the X direction and the Y direction. Furthermore, in the memory cell array unit 2B, a word line WL and an axon line AL extending in the X direction are arranged for each of memory cells 3B arranged in the Y direction. Furthermore, in the memory cell array unit 2B, bit line bars $BL_2$ (BL-) extending in the Y direction are arranged for the memory cells 3B arranged in the X direction. In the memory cell array unit 2B, complementary dendrite lines (a dendrite line $DL_1$ and a dendrite line bar (dendrite line-) $DL_2$) extending in the Y direction are arranged for each of the memory cells 3B arranged in the X direction. Then, each memory cell 3B of the plurality of memory cells 3B is disposed at an intersection between corresponding word line WL, the complementary bit lines ($BL_1$ and $BL_2$), and the dendrite line $DL_2$.

In the memory cell array unit 2B, the bit line $BL_1$ of the second embodiment described above is eliminated, and the dendrite line $DL_1$ is used as a bit line when writing data to the memory cell 3B.

Here, during a product-sum calculation process (inference in a neural network), the memory cell array unit 2B functions as a product-sum calculation circuit, the axon line AL functions as an axon, and the dendrite line $DL_1$ and the dendrite line bar $DL_2$ function as a dendrite and a dendrite bar (dendrite-). On the other hand, when data is written to the memory cell 3B, the dendrite line $DL_1$ functions as a bit line.

<<Configuration of Memory Cell>>

Figure 8:
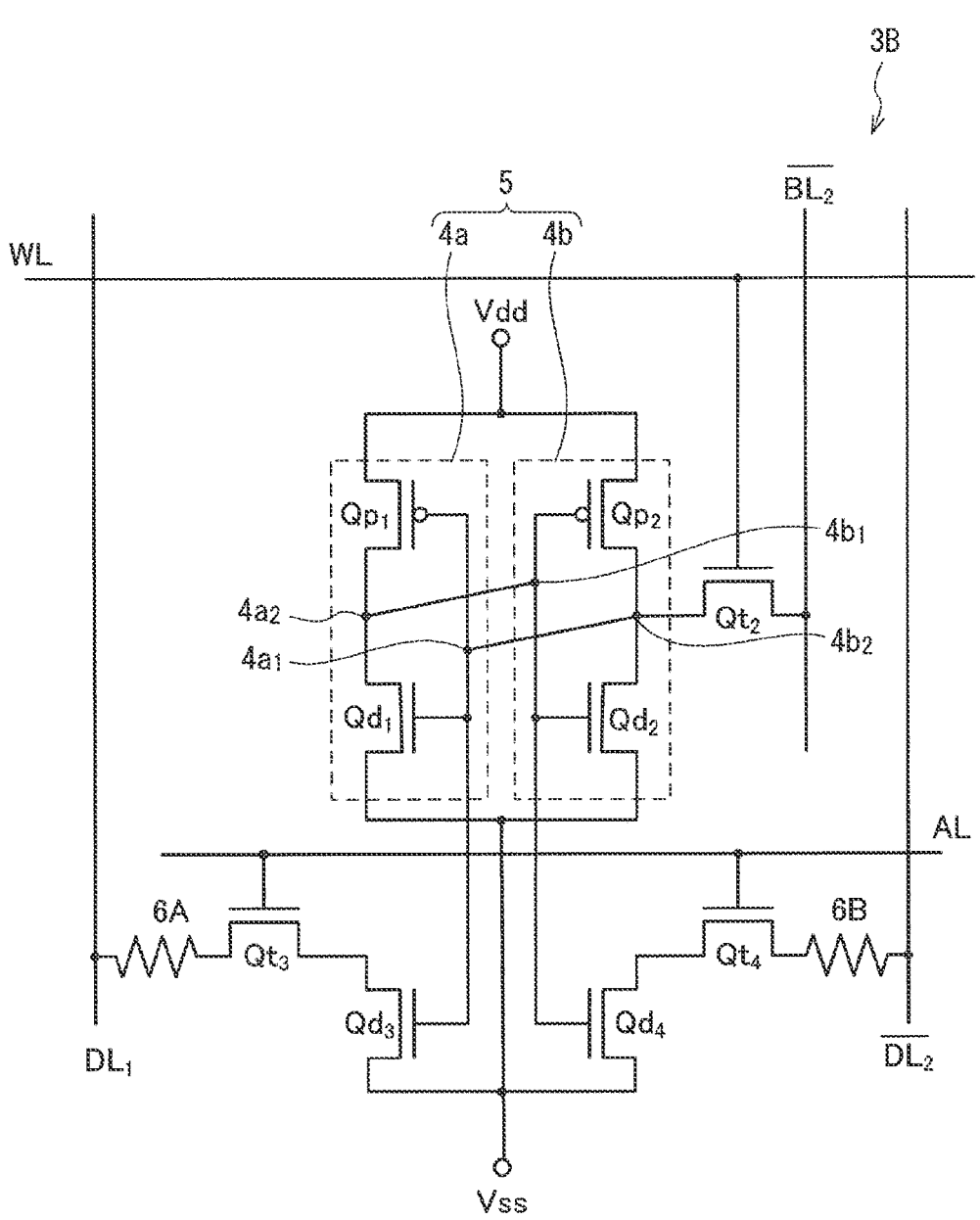
FIG. 8 is an equivalent circuit diagram of the memory cell in FIG. 7.

As illustrated in FIG. 8, each memory cell 3B of the plurality of memory cells 3B includes a flip-flop circuit 5, a transfer FET $Qt_2$ as a first transfer field effect transistor, two transfer FETs $Qt_3$ and $Qt_4$ as second transfer field effect transistors, two drive FETs $Qd_3$ and $Qd_4$ as second drive field effect transistors, and two resistance elements 6A and 6B. The memory cell 3B has a configuration basically similar to that of the memory cell 3A of the second embodiment described above, and is different in that one transfer FET $Qt_1$ is eliminated and the gate electrode of each of the two transfer FETs $Qt_3$ and $Qt_4$ is electrically connected to the axon line AL. Other configurations are similar to those of the memory cell 3A of the second embodiment described above. However, similarly to the second embodiment, the transfer FET $Qt_2$ may be added.

The two resistance elements 6A and 6B of the third embodiment also have an MIM structure similarly to the resistance elements 6A and 6B of the first embodiment described above, can obtain a desired resistance value with a small area, and are arranged within an occupied area of the memory cell. Then, a resistance value of each of the two resistance elements 6A and 6B is preferably larger than a channel resistance value of the transfer FETs $Qt_3$ and $Qt_4$, and more preferably 1 M$\Omega$ or more.

<Write Operation and Product-Sum Calculation>

Next, an operation of writing data to the memory cell 3B and a product-sum calculation will be described.

As the write operation of data to the memory cell 3B, by applying the Vcc potential (for example, 1 V) to the word line WL to turn on the transfer FET $Qt_2$ and setting the bit line bar $BL_2$ to the Vss potential, the output portion (storage node portion) $4a_2$ of one inverter circuit 4a is set to the Vcc potential, the output portion (storage node portion) $4b_2$ of the other inverter circuit 4b is set to the Vss potential. Even if the word line WL is set to the Vss potential, the flip-flop circuit 5 including the two inverter circuits 4a and 4b is stabilized. By setting the bit line bar $BL_2$ to the Vcc potential, the output portion (storage node portion) $4a_2$ of one inverter circuit 4a is set to the Vss potential, the output portion (storage node portion) $4b_2$ of the other inverter circuit 4b is set to the Vcc potential. Even if the word line WL is set to the Vss potential, the flip-flop circuit 5 including the two inverter circuits 4a and 4b is stabilized.

On the other hand, during a product-sum calculation (inference) using the memory cell array unit 2B as a product-sum calculation circuit, the dendrite line $DL_1$ and the dendrite line bar $DL_2$ are precharged to the Vcc potential (for example, 1 V) in a state in which the flip-flop circuit 5 of the memory cell 3B stores data. Subsequently, a signal (for example, a pulse voltage) is input sequentially to the axon line AL as an axon or to the plurality of axon lines AL. When the signal reaches the Vcc potential, the two transfer FETs Qt3 and Qt4 are turned on, and the other drive FET $Qd_4$ having the gate electrode 16d connected to the output portion (storage node portion) $4a_2$ of the one inverter circuit 4a is turned on. Therefore, the charge of the dendrite line bar $DL_2$ is released toward the Vss potential, and the potential decreases. On the other hand, since one drive FET $Qd_3$ having the gate electrode 16d connected to the output portion $4b2$ of the other inverter circuit 4b is in an OFF state, the charge of the dendrite line $DL_1$ is not released, and the potential does not change.

Here, the potential of the dendrite line bar $DL_2$ (dendrite line-) changes with the CR time constant of the resistance value R of the resistance element 6B and the parasitic capacitance C parasitic on the dendrite line bar $DL_2$. The resistance elements 6A and 6B are connected to the drive FETs Qd3 and Qd4 for product-sum calculation, and thus do not affect writing of data to the memory cell 3B. Therefore, by outputting or AD-converting a potential difference between the dendrite line $DL_1$ and the dendrite line bar $DL_2$ (dendrite line-) in response to the CR time constant, the sum-product calculation with high power efficiency can be performed.

In the memory cell 3B of the third embodiment, since the word line WL is in an OFF state in which the potential is not supplied even in an ON state in which the Vcc potential is supplied to the axon line AL, the transfer FET $Qt_2$ of the memory cell can be turned off even during the product-sum calculation, and the low power consumption and the stabilization of the memory operation can be achieved.

Note that the input potential to the word line WL, that is, the axon at the time of the sum-product calculation can be freely set separately from the Vcc potential or a write potential applied to the word WL at the time of writing data to the memory cell 3A. Writing of data into the flip-flop circuit 5 of the memory cell 3A is usually performed at a high speed through an SRAM operation. By reducing the Vcc potential during the SRAM operation and increasing the threshold voltage Vth of each of the transfer FETs $Qp_1$ and $Qp_2$ and the drive FTEs $Qd_1$ and $Qd_2$, the current consumption can be reduced.

Main Effects of Third Embodiment

As described above, the memory cell 3B of the semiconductor device 1B according to the third embodiment includes the flip-flop circuit 5, the three transfer FETs $Qt_2$, $Qt_3$, and $Qt_4$, the two drive FETs $Qd_3$ and $Qd_4$, and further includes the two resistance elements 6A and 6B. Then, each of the two resistance elements 6A and 6B has a resistance value of 1 M$\Omega$ or more, which is necessary in a case where a bit line as a summation line is charged with product-sum charge for multiple bits (for example, 1024), during a product-sum calculation process, and is disposed within an occupied area of the memory cell 3B. Therefore, also in the semiconductor device 1B according to the third embodiment, similarly to the semiconductor device 1 according to the first embodiment described above, it is possible to perform a product-sum calculation with high power efficiency while maintaining a small area of the memory cell 3B.

Fourth Embodiment

In a fourth embodiment, an SRAM-type memory cell including six field effect transistors and four tunnel field effect transistors will be described.

<<Configuration of Memory Cell Array Unit>>

Figure 9:
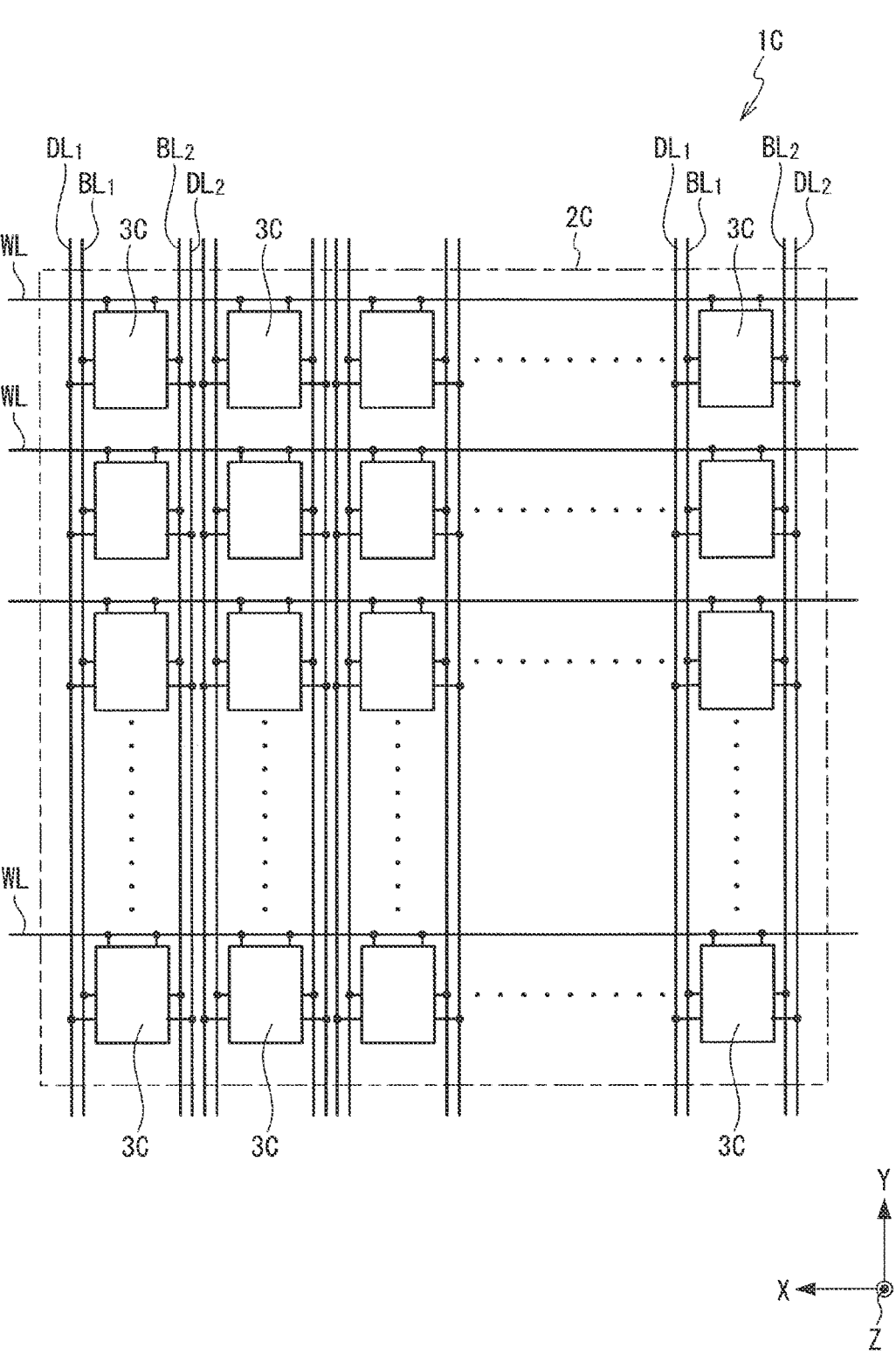
FIG. 9 is a diagram illustrating a schematic configuration of a memory cell array unit of a semiconductor device according to a fourth embodiment of the present technology.

A semiconductor device 1C according to the second embodiment includes a memory cell array unit 2C illustrated in FIG. 9. As illustrated in FIG. 9, in the memory cell array unit 2C, a plurality of memory cells 3C is arranged in a matrix on a two-dimensional plane including the X direction and the Y direction. Furthermore, in the memory cell array unit 2A, similarly to the memory cell array unit 2A of the second embodiment described above, word lines WL extending in the X direction are arranged for each of memory cells 3C arranged in the Y direction, complementary bit lines (a bit line $BL_1$ and a bit line bar $BL_2$ ($BL_2$-)) extending in the Y direction are arranged for each of the memory cells 3C arranged in the X direction, and complementary dendrite lines (dendrite line $DL_1$ and dendrite line bar (dendrite line-) $DL_2$) extending in the Y direction are arranged for each of the memory cells 3C arranged in the X direction. Then, each memory cell 3B of the plurality of memory cells 3B is disposed at an intersection between the corresponding word line WL and the complementary bit lines ($BL_1$ and $BL_2$) and complementary dendrite lines ($DL_1$ and $DL_2$).

Figure 10:
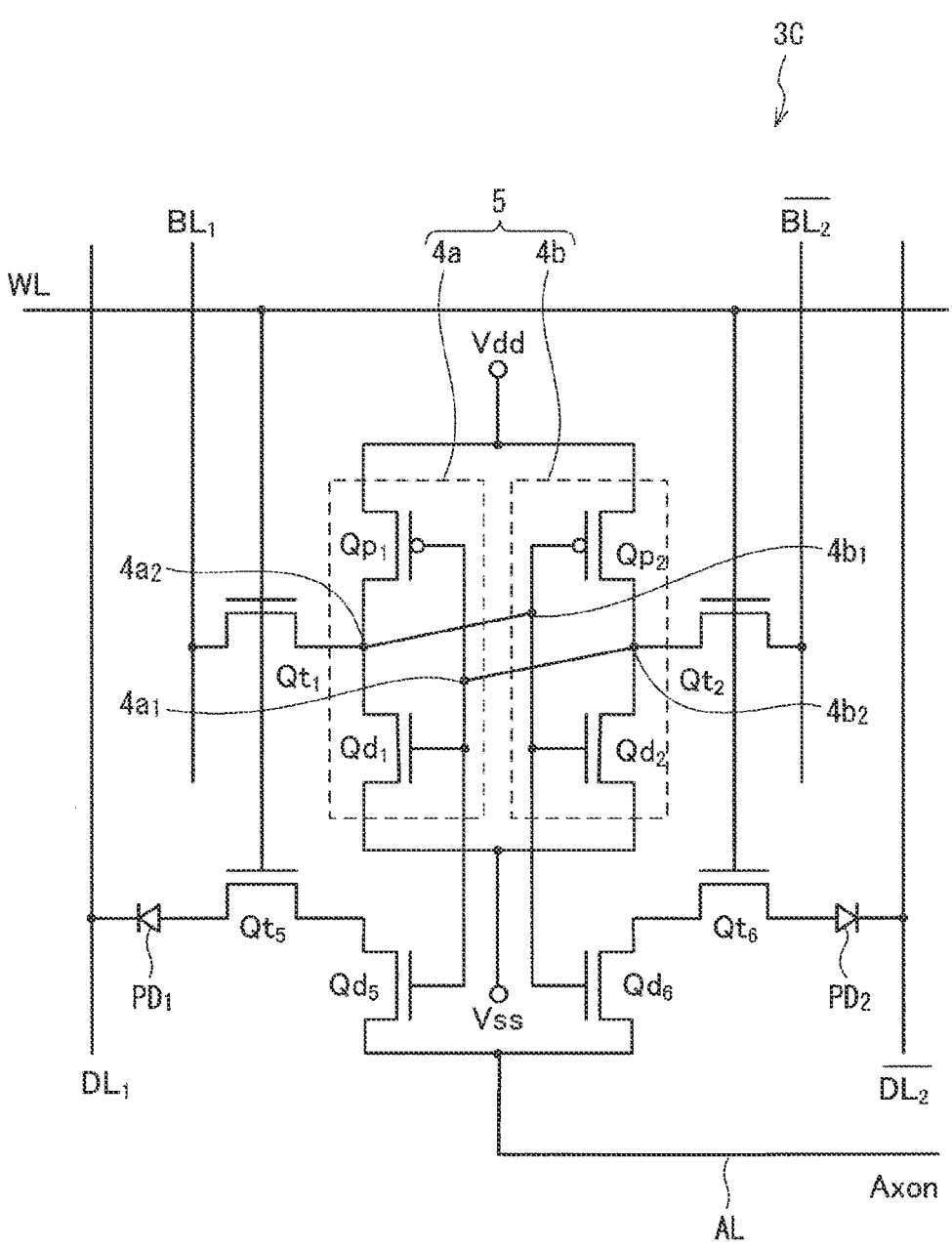
FIG. 10 is an equivalent circuit diagram of the memory cell in FIG. 9.

Here, during a product-sum calculation process (inference in the neural network), the memory cell array unit 2C functions as a product-sum calculation circuit, the axon line AL illustrated in FIG. 10 functions as an axon, and the dendrite line $DL_1$ and the dendrite line bar $DL_2$ function as a dendrite and a dendrite bar (dendrite-).

<<Configuration of Memory Cell>>

As illustrated in FIG. 10, each memory cell 3C of the plurality of memory cells 3C includes a flip-flop circuit 5, two transfer FETs $Qt_1$ and $Qt_2$ as first transfer field effect transistors, two transfer tunnel FETs $Qt_5$ and $Qt_6$ as second transfer tunnel field effect transistors, and two drive tunnel FETs $Qd_5$ and $Qd_6$ as second drive tunnel field effect transistors. The memory cell 3C has a configuration basically similar to that of the memory cell 3A of the second embodiment described above, and includes drive tunnel FETs $Qd_5$ and $Qd_6$ and transfer tunnel FETs $Qt_5$ and $Qt_6$ instead of the resistance elements 6A and 6B, the drive FTEs $Qd_3$ and $Qd_4$, and the transfer FETs $Qt_3$ and $Qt_4$ of the second embodiment described above.

The two drive tunnel FETs $Q_5$ and $Qd_6$ each have a gate electrode (control electrode) and a pair of n-type first main electrode region and p-type second main electrode region functioning as a source region and a drain region, and electrical conduction between the n-type first main electrode region and the p-type main electrode separation region is controlled by a gate signal input to the gate electrode.

As illustrated in FIG. 10, the gate electrode of one drive tunnel FET $Q_5$ of the two drive tunnel FETs $Qd_5$ and $Qd_6$ is electrically connected to the gate electrode of each of the load FET $Qp_1$ and the drive FET $Qd_5$ configuring one inverter circuit 4a. That is, the gate electrode of the one drive tunnel FET $Qd_5$ is electrically connected to the input portion $4a_1$ of the one inverter circuit 4a.

As illustrated in FIG. 10, in the other drive tunnel FET $Qd_6$ of the two drive tunnel FETs $Qd_5$ and $Qd_6$, the gate electrode is electrically connected to the gate electrode of each of the load FET $Qp_2$ and the drive FET $Qd_2$ configuring the other inverter circuit 4b. That is, the gate electrode of the other drive tunnel FET $Qd_6$ is electrically connected to the input portion $4b_1$ of the other inverter circuit 4b.

As illustrated in FIG. 10, the n-type first main electrode region of each of the two drive tunnel FETs $Qd_5$ and $Qd_6$ is electrically connected to the axon line AL.

As illustrated in FIG. 10, in one transfer FET $Qt_5$ of the two transfer tunnel FETs $Qt_5$ and $Qt_6$, the gate electrode is electrically connected to the word line WL, and the p-type second main electrode region is electrically connected to the p-type second main electrode region of one drive tunnel FET $Qd_5$. Then, in the one transfer tunnel FET $Qt_5$, the n-type first main electrode region is electrically connected to the dendrite line $DL_1$.

As illustrated in FIG. 10, in the other transfer tunnel FET $Qt_6$ of the two transfer tunnel FETs $Qt_5$ and $Qt_6$, the gate electrode is electrically connected to the word line WL, and the p-type second main electrode region is electrically connected to the p-type second main electrode region of the other drive tunnel FET $Qd_6$. Then, in the other transfer tunnel FET $Qt_6$, the n-type first main electrode region is electrically connected to the dendrite line bar (dendrite line) $DL_2$.

As illustrated in FIG. 10, in the two drive tunnel FETs $Qd_5$ and $Qd_6$ and the two transfer tunnel FETs $Qt_5$ and $Qt_6$, a pair of main electrode regions functioning as a source region and a drain region includes the n-type first main electrode region and the p-type second main electrode region. Therefore, a pn-type parasitic diode $PD_1$ is formed in an equivalent circuit on a conductive path connecting the one transfer tunnel FET $Qt_5$ to the dendrite line DL1. Furthermore, a pn-type parasitic diode $PD_2$ is formed in an equivalent circuit on a conductive path connecting the other transfer tunnel FET $Qt_6$ to the dendrite line bar $DL_2$.

<<Write Operation and Product-Sum Calculation>>

Next, an operation of writing data to the memory cell 3C and a product-sum calculation will be described.

As a write operation to the memory cell 3C, by applying the Vcc potential (for example, 1 V) to the word line WL to turn on the two transfer FETs $Qt_1$ and $Qt_2$ and setting the bit line $BL_1$ to the Vcc potential and the bit line bar $BL_2$ to the Vss potential, the output portion (storage node portion) $4a_2$ of one inverter circuit 4a is set to the Vcc potential and the output portion (storage node portion) $4b_2$ of the other inverter circuit 4b is set to the Vss potential. Even if the word line WL is set to the Vss potential, the flip-flop circuit 5 including the two inverter circuits 4a and 4b is stabilized.

On the other hand, at the time of a product-sum calculation (inference) using the memory cell array unit 2C as a product-sum calculation circuit, the dendrite line $DL_1$ and the dendrite line bar $DL_2$ are precharged to the Vss potential (for example, 0 V) in a state in which the flip-flop circuit 5 of the memory cell 3C stores data. Subsequently, a signal (for example, a pulse voltage) is input to the axon line AL. When the signal reaches the Vcc potential, since the other drive tunnel FET $Qd_6$ having the gate electrode connected to the output portion (storage node portion) $4a_2$ of the one inverter circuit 4a is in an ON state, the dendrite line bar $DL_2$ is charged by being supplied with electric charge from the axon line AL. In this case, even when the word line WL has the Vss potential and the other transfer tunnel FET Qt6 is in an OFF state, since the source region (second main electrode region) side of the transfer tunnel FET Qt6 has a high potential, the parasitic diode PD2 operates in the forward direction, and the charging of the dendrite line bar $DL_2$ is not inhibited.

On the other hand, since one drive tunnel FET $Qd_5$ electrically connected to the output portion (storage node portion) $4b_2$ of the other inverter circuit 4b is in an OFF state, the dendrite line $DL_1$ is not charged with the electric charge from the axon line AL and the potential is maintained.

The potential of the dendrite line bar $DL_2$ changes with the CR time constant of the channel resistance value R of each of the drive tunnel FET Qd6 and the transfer tunnel FET Qt6 and the parasitic capacitance C of the dendrite line bar $DL_2$. The transfer FET connected to the storage node portion of the flip-flop circuit is a normal MOSFET, and thus does not affect writing of data to the memory cell. Furthermore, even if the signal of the axon line AL becomes the Vss potential (ground potential) and the dendrite line bar $DL_2$ has a high potential, the transfer tunnel FET Qt6 is in an OFF state, and the parasitic diode PD2 is in an opposite direction, so that the electric charge does not flow back from the dendrite line bar $DL_2$ to the axon line AL. Therefore, by outputting or AD-converting a potential difference between the dendrite line $DL_1$ and the dendrite line bar $DL_2$ (dendrite line-) in response to the CR time constant, the sum-product calculation with high power efficiency can be performed.

The two drive tunnel FETs $Q_5$ and $Qd_6$ and the two transfer tunnel FETs $Qt_5$ and $Qt_6$ can increase the channel resistance value with a small area compared with a normal MOSFET. That is, during the product-sum calculation process, it is possible to obtain a resistance value of 1 MΩ or more, which is necessary in a case where a bit line as a summation line is charged with product-sum charge for multiple bits (for example, 1024) with a small area compared with the MOSFET. Therefore, also in the semiconductor device 1A according to the fourth embodiment, similarly to the semiconductor device 1 according to the first embodiment described above, it is possible to perform a product-sum calculation with high power efficiency while maintaining a small area of the memory cell 3C.

Note that a channel resistance value of the two drive tunnel FETs $Q_5$ and $Qd_6$ and the two transfer tunnel FETs $Qt_5$ and $Qt_6$ is preferably larger than a channel resistance value of the transfer FETs $Qt_3$ and $Qt_4$, and more preferably 1 MΩ or more.

MODIFICATION EXAMPLES

First Modification Example

Figure 11:
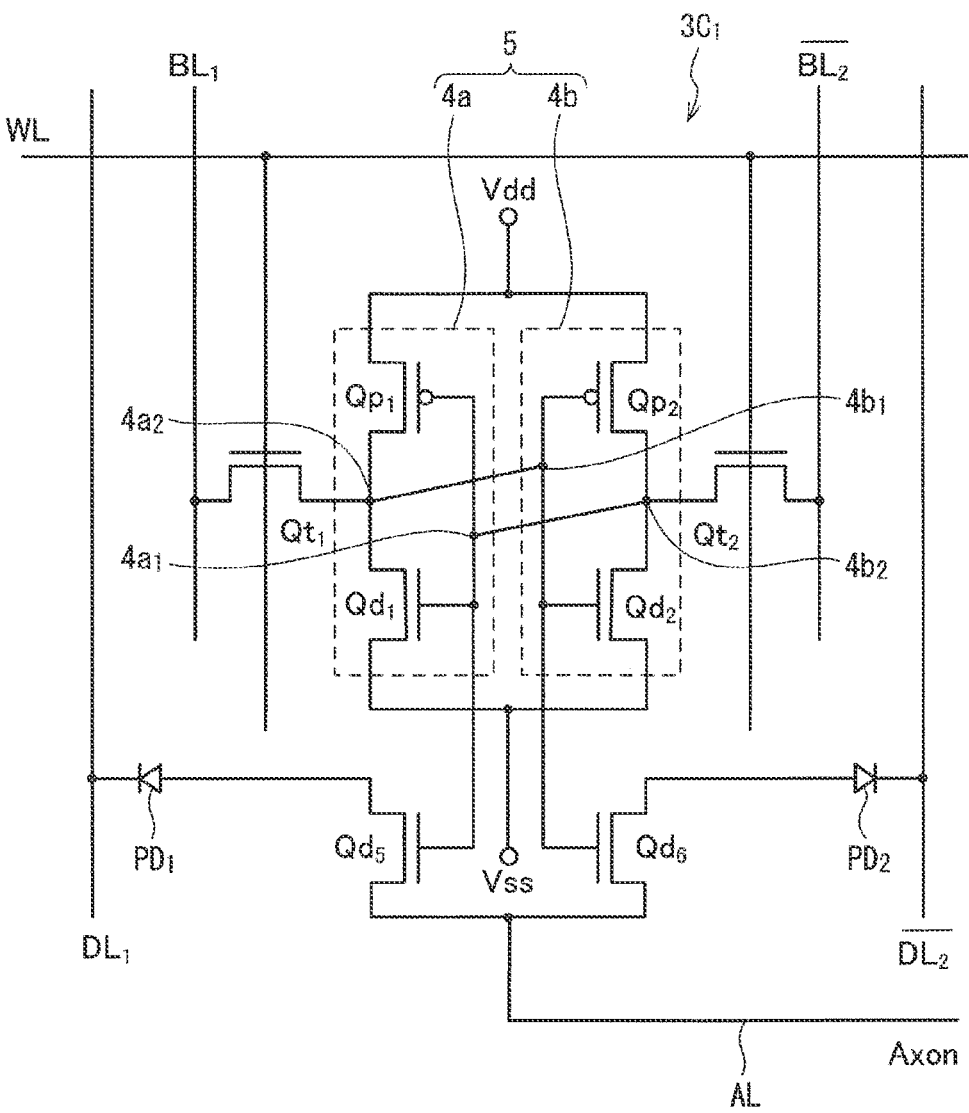
FIG. 11 is a transmissive circuit diagram illustrating a modification example of the memory cell according to the fourth embodiment.

FIG. 11 is an equivalent circuit diagram of a memory cell according to a first modification example of the fourth embodiment.

As illustrated in FIG. 11, a memory cell $3C_1$ basically has a configuration similar to that of the memory cell of the fourth embodiment described above, and has a configuration in which the two transfer tunnel FETs $Qt_5$ and $Qt_6$ illustrated in FIG. 10 are omitted compared with the memory cell of the fourth embodiment.

That is, as illustrated in FIG. 11, the memory cell $3C_1$ of the first modification example includes the flip-flop circuit 5, the two transfer FETs $Qt_1$ and $Qt_2$, and the two drive tunnel FETs $Q_5$ and $Qd_6$, and does not include the two transfer tunnel FETs $Qt_5$ and $Qt_6$ illustrated in FIG. 10. Therefore, the p-type second main electrode region of one drive tunnel FET $Q_5$ is electrically connected to the dendrite line $DL_1$ without passing through the transfer tunnel FET, and the p-type second main electrode region of the other drive tunnel FET $Qd_6$ is electrically connected to the dendrite line bar $DL_2$ without passing through the transfer tunnel FET.

Also in the memory cell $3C_1$ of the first modification example configured as described above, effects similar to those of the above-described fourth embodiment can be achieved.

Second Modification Example

Figure 12:
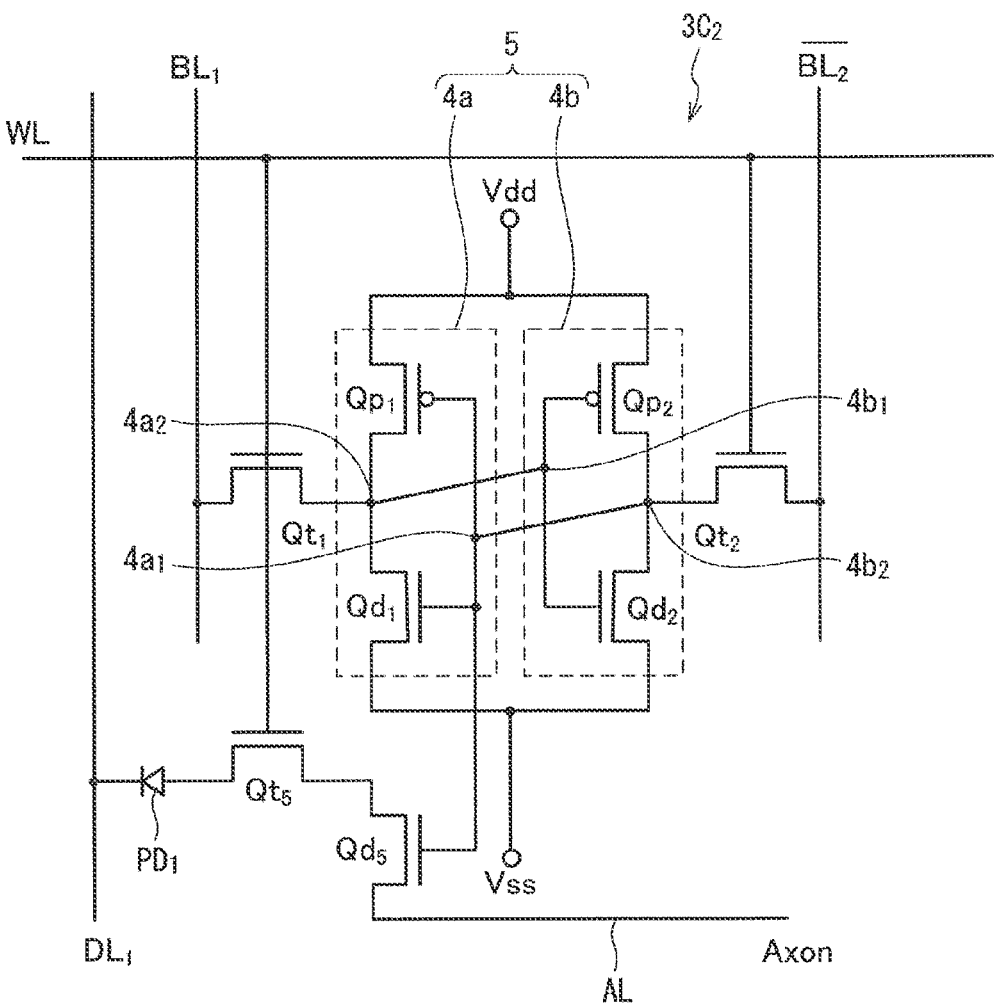
FIG. 12 is a transmissive circuit diagram illustrating a modification example of the memory cell according to the fourth embodiment.

FIG. 12 is an equivalent circuit diagram of a memory cell according to a second modification example of the fourth embodiment.

As illustrated in FIG. 12, a memory cell $3C_2$ basically has a configuration similar to that of the memory cell 3C of the above-described fourth embodiment, and has a configuration in which the drive tunnel FET $Qd_6$ and the transfer tunnel FET $Qt_6$ on the other inverter circuit 4b side illustrated in FIG. 10 are omitted compared with the memory cell 3C of the fourth embodiment.

That is, as illustrated in FIG. 12, the memory cell $3C_2$ of the second modification example includes the flip-flop circuit 5, the two transfer FETs $Qt_1$ and $Qt_2$, and further includes one drive tunnel FET $Q_5$ and one transfer tunnel FET $Qt_6$. Then, in the memory cell array unit, the dendrite line bar $DL_2$ illustrated in FIG. 10 is omitted.

Also in the memory cell $3C_2$ of the second modification example configured as described above, effects similar to those of the above-described fourth embodiment can be achieved.

Note that the present technology may have the following configurations.

(1)
A semiconductor device including:
a memory cell array in which a plurality of memory cells is arranged in a matrix, in which
each memory cell of the plurality of memory cells includes
a flip-flop circuit including two inverter circuits in each of which a load field effect transistor and a drive field effect transistor are connected in series, input portions and output portions of the two inverter circuits being cross-joined to each other,
two transfer field effect transistors each having a gate electrode connected to a word line, and a pair of first and second main electrode regions, the first main electrode regions being respectively connected to the output portions of the two inverter circuits, and
two resistance elements of which one end sides are respectively connected to the second main electrode regions of the two transfer field effect transistors and other end sides are respectively connected to a bit line and a bit line bar.

(2)
The semiconductor device according to (1), in which a resistance value of the resistance elements is greater than a channel resistance value of the transfer field effect transistors.

(3)
The semiconductor device according to (1), in which a resistance value of the resistance elements is 1 MΩ or more.

(4)
The semiconductor device according to (1) or (2), in which when a product-sum calculation is performed, the word line functions as an axon, the bit line functions as a dendrite, and the bit line bar functions as a dendrite bar.

(5)
A semiconductor device including:
a memory cell array in which a plurality of memory cells is arranged in a matrix, in which
each memory cell of the plurality of memory cells includes
a flip-flop circuit including two inverter circuits in each of which a load field effect transistor and a first drive field effect transistor are connected in series, input portions and output portions of the two inverter circuits being cross-joined to each other,
two first transfer field effect transistors each having a gate electrode connected to a word line, and a pair of first and second main electrode regions, the first main electrode regions being respectively connected to the output portions of the two inverter circuits, and the second main electrode regions being respectively connected to a bit line and a bit line bar,
two second drive field effect transistors each having a gate electrode and a pair of first and second main electrode regions, the gate electrodes being respectively connected to the input portions of the two inverter circuits, and the first main electrode regions being connected to each other,
two second transfer field effect transistors each having a gate electrode connected to the word line, and a pair of first and second main electrode regions, the first main electrode regions being respectively connected to the second main electrode regions of the two second drive field effect transistors, and two resistance elements of which one end sides are respectively connected to the second main electrode regions of the two second transfer field effect transistors and other end sides are respectively connected to a dendrite line and a dendrite line bar.

(6)

The semiconductor device according to (5), in which a resistance value of the resistance elements is greater than a channel resistance value of the transfer field effect transistors.

(7)

The semiconductor device according to (5), in which a resistance value of the resistance elements is 1 MΩ or more.

(8)

The semiconductor device according to any one of (5) to (7), in which when a product-sum calculation is performed, the word line functions as an axon.

(9)

A semiconductor device including:

a memory cell array in which a plurality of memory cells is arranged in a matrix, in which each memory cell of the plurality of memory cells includes a flip-flop circuit including two inverter circuits in each of which a load field effect transistor and a first drive field effect transistor are connected in series, input portions and output portions of the two inverter circuits being cross-joined to each other, a first transfer field effect transistor having a gate electrode connected to a word line, and a pair of first and second main electrode regions, the first main electrode region being connected to the output portion of the other inverter circuit of the two inverter circuits, and the second main electrode region being connected to a bit line bar, two second drive field effect transistors each having a gate electrode and a pair of first and second main electrode regions, the gate electrodes being respectively connected to the input portions of the two inverter circuits, and the first main electrode regions being connected to each other, two second transfer field effect transistors each having a gate electrode connected to an axon line, and a pair of first and second main electrode regions, the first main electrode regions being respectively connected to the second main electrode regions of the two second drive field effect transistors, and two resistance elements of which one end sides are respectively connected to the second main electrode regions of the two second transfer field effect transistors and other end sides are respectively connected to a dendrite line and a dendrite line bar.

(10)

The semiconductor device according to (9), in which a resistance value of the resistance elements is greater than a channel resistance value of the transfer field effect transistors.

(11)

The semiconductor device according to (9), in which a resistance value of the resistance elements is 1 MΩ or more.

(12)

A semiconductor device including:

a memory cell array in which a plurality of memory cells is arranged in a matrix, in which each memory cell of the plurality of memory cells includes a flip-flop circuit including two inverter circuits in which a load field effect transistor and a first drive field effect transistor are connected in series, input portions and output portions of the two inverter circuits being cross-joined to each other, two first transfer field effect transistors each having a gate electrode connected to a word line, and a pair of first and second main electrode regions, the first main electrode regions being respectively connected to the output portions of the two inverter circuits, and the second main electrode regions being respectively connected to a bit line and a bit line bar, two second drive tunnel field effect transistors each having a gate electrode and a pair of n-type first main electrode region and p-type second main electrode region, the gate electrodes being respectively connected to the input portions of the two inverter circuits, and the n-type first main electrode region being connected to an axon line, and two second transfer tunnel field effect transistors each having a gate electrode connected to the word line, and a pair of n-type first main electrode region and p-type second main electrode region, the p-type second main electrode regions being respectively connected to the p-type second main electrode regions of the two second drive tunnel field effect transistors, and the n-type first main electrode regions being respectively connected to a dendrite line and a dendrite line bar.

The scope of the present technology is not limited to the illustrated and described exemplary embodiments, but also includes all embodiments that provide equivalent effects to those for which the present technology is intended. Moreover, the scope of the present technology is not limited to the combinations of the features of the invention defined by the claims, but may be defined by any desired combination of specific features among all the disclosed respective features.

REFERENCE SIGNS LIST

1 Semiconductor device
2 Memory cell array unit
3 Memory cell
4a, 4b Inverter circuit
$4a_1$, $4b_1$ Input portion
$4a_2$, $4b_2$ Output portion (storage node portion)
5 Flip-flop circuit
6A, 6B Resistance element
$Qd_1$, $Qd_2$, $Qd_3$, $Qd_4$ Drive field effect transistor (pull-down transistor)
$Qp_1$, $Qp_2$ Load field effect transistor (pull-up transistor)
$Qt_1$, $Qt_2$, $Qt_3$, $Qt_4$ Transfer field effect transistor (pass gate transistor)
10 Semiconductor layer
11 Isolation region
12a n-type well region
12b p-type well region
15 Gate insulating film
16d, 16p, 16t Gate electrode
$17d_1$, $17p_1$, $17t_1$ First main electrode region
$17d_2$, $17p_2$, $17t_2$ Second main electrode region
21 Interlayer insulating film
22a, 22b, 22c, 22d, 22e Conductive plug
23a First electrode
23b Insulating film
23c Second electrode
24 Interlayer insulating film 25$a_1$, 25$a_2$, 25$c_1$, 25$c_2$, 25$d_1$, 25$d_2$, 25$e_1$, 25$e_2$ Relay wiring 26 Interlayer insulating film 27 Conductive plug 28$c_1$, 28$c_2$ Ground wiring 28$d$ Power supply line AL Axon line BL$_1$ Bit line BL$_2$ Bit line bar DL$_1$ Dendrite line DL$_2$ Dendrite line bar WL Word line Qd$_1$, Qd$_2$, Qd$_3$, Qd$_4$ Drive field effect transistor (drive FET)

Qp$_1$, Qp$_2$ Load field effect transistor (drive FET)

Qt$_1$, Qt$_2$, Qt$_3$, Qt$_4$ Transfer field effect transistor (transfer FET)

Qd$_5$, Qd$_6$ Drive tunnel field effect transistor (drive tunnel FET)

Qt$_5$, Qt$_6$ Transfer tunnel field effect transistor (transfer tunnel FET)

PD$_1$, PD$_2$ Parasitic diode

The invention claimed is:

1. A semiconductor device, comprising:

a memory cell array in which a plurality of memory cells are arranged in a matrix, wherein each memory cell of the plurality of memory cells includes:

a flip-flop circuit including two inverter circuits, wherein in each of the two inverter circuits, a load field effect transistor and a drive field effect transistor are connected in series, and input portions of the two inverter circuits are cross-joined to output portions of the two inverter circuits;

two transfer field effect transistors, wherein each of the two transfer field effect transistors has a gate electrode connected to a word line, and a pair of first and second main electrode regions, and first main electrode regions of the pair of the first and second main electrode regions are respectively connected to the output portions of the two inverter circuits; and two resistance elements, wherein a first end side of each of the two resistance elements is connected to a respective second main electrode region of a corresponding one of the two transfer field effect transistors, a second end side of each of the two resistance elements is respectively connected to a bit line and a bit line bar, a resistance value of each of the two resistance elements is greater than a channel resistance value of each of the two transfer field effect transistors, and each of the two resistance elements is in a low resistance state having a resistance sufficiently larger than that of the bit line and bit line bar, respectively, during a product-sum calculation.

2. The semiconductor device according to claim 1, wherein the resistance value of the two resistance elements is 1 MΩ or more.

3. The semiconductor device according to claim 1, wherein in a case where the product-sum calculation is executed, the word line is configured to function as an axon, the bit line is configured to function as a dendrite, and the bit line bar is configured to function as a dendrite bar.

* * * * *